(12) United States Patent
Kurosawa et al.

(10) Patent No.: US 6,972,392 B2
(45) Date of Patent: Dec. 6, 2005

(54) LASER BEAM MACHINING METHOD FOR WIRING BOARD, LASER BEAM MACHINING APPARATUS FOR WIRING BOARD, AND CARBONIC ACID GAS LASER OSCILLATOR FOR MACHINING WIRING BOARD

(75) Inventors: Miki Kurosawa, Tokyo (JP); Tsukasa Fukushima, Tokyo (JP); Masanori Mizuno, Tokyo (JP); Shozui Takeno, Tokyo (JP); Masaharu Moriyasu, Tokyo (JP); Masayuki Kaneko, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 405 days.

(21) Appl. No.: 09/994,719

(22) Filed: Nov. 28, 2001

(65) Prior Publication Data

US 2002/0033387 A1 Mar. 21, 2002

Related U.S. Application Data

(62) Division of application No. 09/549,498, filed on Apr. 14, 2000, now Pat. No. 6,373,026, which is a division of application No. 08/690,140, filed on Jul. 31, 1996.

(30) Foreign Application Priority Data

Aug. 7, 1995 (JP) ................................. 7-201194
Mar. 15, 1996 (JP) ................................. 8-059862

(51) Int. Cl.$^7$ ............................................. B23K 26/38
(52) U.S. Cl. ................................................ 219/121.72
(58) Field of Search ................... 219/121.61, 121.67, 219/121.68, 121.69, 121.7, 121.71, 121.75

(56) References Cited

U.S. PATENT DOCUMENTS

| | | | |
|---|---|---|---|
| 4,122,240 A | 10/1978 | Banas et al. | 219/121.65 |
| 4,248,369 A | 2/1981 | Clausen | 219/121.85 |
| 4,504,727 A * | 3/1985 | Melcher et al. | 219/121.62 |
| 4,701,591 A | 10/1987 | Masaki et al. | 219/121.77 |
| 4,959,119 A | 9/1990 | Lantzer | 219/121.69 |
| 5,037,183 A | 8/1991 | Gagosz et al. | 219/121.7 X |
| 5,168,454 A | 12/1992 | LaPlante et al. | 219/121.7 X |
| 5,235,154 A | 8/1993 | Economikos | 219/121.69 |
| 5,293,025 A | 3/1994 | Wang | 219/121.71 |
| 5,294,567 A | 3/1994 | Dorfman et al. | 219/121.69 |
| 5,302,798 A | 4/1994 | Inagawa et al. | 219/121.7 |
| 5,378,869 A | 1/1995 | Marrs et al. | 219/121.71 |
| 5,430,816 A * | 7/1995 | Furuya et al. | 385/33 |
| 5,593,606 A | 1/1997 | Owen et al. | 219/121.71 |
| 5,670,067 A * | 9/1997 | Koide et al. | 219/121.68 |
| 5,674,414 A | 10/1997 | Schweizer | 219/121.74 |
| 5,676,866 A | 10/1997 | in den Bäumen et al. | 219/121.74 |

FOREIGN PATENT DOCUMENTS

GB 1593268 7/1981 ............. 219/121.77

(Continued)

*Primary Examiner*—Jonathan Johnson
(74) *Attorney, Agent, or Firm*—Sughrue Mion, PLLC

(57) ABSTRACT

In a laser beam machining method for a wiring board, a machined portion of the wiring board is irradiated with a pulsed laser beam for a beam irradiation time ranging from about 10 to about 200 μs and with energy density of about 20 J/cm$^2$ or more, thereby machining the wiring board, for example, drilling for a through-hole and a blind via hole, grooving, and cutting for an outside shape.

3 Claims, 18 Drawing Sheets

FOREIGN PATENT DOCUMENTS

| | | | | |
|---|---|---|---|---|
| JP | 56-4391 | 1/1981 | ............ | 219/121.71 |
| JP | 61-74791 A | 4/1986 | | |
| JP | 63-313681 A | 12/1988 | | |
| JP | 1-218787 A | 8/1989 | | |
| JP | 2-182391 | 7/1990 | ............ | 219/121.76 |
| JP | 3-142087 A | 6/1991 | | |
| JP | B 4-3676 | 1/1992 | | |
| JP | 4-313476 A | 11/1992 | | |
| JP | 4-313477 A | 11/1992 | | |
| JP | 5-55724 A | 3/1993 | | |

\* cited by examiner

LASER BEAM MACHINING METHOD FOR WIRING BOARD, LASER BEAM MACHINING APPARATUS FOR WIRING BOARD, AND CARBONIC ACID GAS LASER OSCILLATOR FOR MACHINING WIRING BOARD

This is a divisional of Application No. 09/549,498 (Confirmation No. Not Yet Assigned) filed Apr. 14, 2000 now U.S. Pat. No. 6,373,026, which is a divisional of Application No. 08/690,140, filed Jul. 31, 1996, the disclosure of which is incorporated herein by reference.

BACKGROUND OF THE INVENTION

1. Field of the Invention

The present invention relates to a machining method for a wiring board and a machining apparatus for a wiring board employing a laser beam for machining such as drilling for a through-hole, an inner via hole, and a blind via hole, grooving, and cutting for an outside shape of the wiring board referred to as so-called printed board, and more particularly to a machining method for a wiring board and a machining apparatus for a wiring board in which a fine conduction hole can rapidly and accurately be formed, and a carbonic acid gas laser oscillator to generate a pulsed laser beam most suitable for the above machining.

2. Description of the Prior Art

A printed board includes a plurality of insulating base materials with conductor layers, stacked and joined in a multi-layer fashion. Among the conductor layers applied onto the insulating base materials, the optional conductor layers in a vertical direction are electrically connected through conduction holes referred to as a through-hole, an inner via hole, and a blind via hole. FIG. 33 is a sectional view of such a conventional multi-layer printed board. In the drawing, reference numeral 51 means a printed board, 52 to 56 are conductor layers, 57 is metallic deposits, 61 to 64 are insulating base materials, and 65 to 68 are conduction holes. In the five-layer printed board 51 including the conductor layers 52 to 56, the insulating base materials 61 and 63 with both sides coated with copper foil and the conductor layer 56 including copper foil are stacked and joined by using the insulating base materials 62 and 64 referred to as prepreg, and the conduction holes 65 to 68 are provided to pass through the conductor layers 52 to 56.

As shown in FIG. 33, the conduction hole 65 is mounted for conduction between the conductor layer 52 and the conductor layer 53 in the insulating base material 61, and the conduction hole 66, referred to as blind via hole (BVH), is mounted for conduction between the conductor layer 52 in the insulating base material 61 and the conductor layer 54 in the insulating base material 63. The conduction hole 67, referred to as inner via hole (IVH), is mounted for conduction between the conductor layer 54 and the conductor layer 55 in the insulating base material 63. The conduction hole 68, referred to as through-hole (TH), is mounted for conduction between the conductor layer 52 in the insulating base material 61 and the conductor layer 56 stacked and joined through the insulating base material 64.

The conduction holes 65 to 68 shown in FIG. 33 are holes machined by a drill. Further, after drilling, the conduction holes are plated through the metallic deposits 57, and the conductor layers are electrically connected.

In the prior art, a machining method for the conduction hole includes, for example, drill machining using a rotary milling cutter. Further, a machining method for grooving or cutting for an outside shape includes, for example, router machining using a rotary milling cutter. On the other hand, in recent years, higher density wiring has been desired for higher performance of an electronic device. A more multi-layered and smaller printed board is required to meet the above requirement. Further, it is essential to provide a finer hole diameter of the conduction hole for this purpose. With the current state of the art, the conduction hole is generally provided in the printed board by the mechanical method using the drill. However, the method has drawbacks in that the finer hole diameter is limited, for example, drilling for a hole diameter of $\phi 0.2$ mm or less is very difficult to cause heavy wear of the drill such as breakage, resulting in poor productivity due to a long time required for replacement of the drill. Further, it is difficult to simultaneously machine adjacent positions, thereby requiring a considerable machining time. In addition, the insulating base material has a thickness of 0.1 mm or less because of the smaller printed board. Since it is difficult to control a hole depth in the drill machining with accuracy of 0.1 mm or less, it is difficult to form a blind via hole in such a thin-walled insulating base material. Further, in order to realize cost reduction by the smaller printed board and an increase in yield, the grooving and the cutting for the outside shape require an accurate depth control in the grooving, a narrower cutting width, and cutting after parts are packaged. However, the mechanical methods such as router machining are unpractical since the above limitation is similarly imposed thereon.

Instead of the machining methods for the printed board including the above mechanical methods, attention has been given to methods, which have partially been put to practical use, employing a laser beam such as an eximer laser or carbonic acid gas laser, disclosed in IBM Journal of Research and Development, Vol. 126, No.3, pp.306–317 (1982), and Japanese Patent Publication (Kokoku) No. 4-3676. These laser beam machining methods utilize a difference in absorption coefficient of light energy such as the eximer laser or the carbonic acid gas laser between resin or glass fiber serving as the insulating base material forming the printed board, and copper serving as the conductor layer. For example, since almost the entire laser beam emitted from the above laser can be reflected at the copper, a copper foil removed portion having a required diameter is formed in top copper foil through etching and so forth, and the copper foil removed portion may be irradiated with the laser beam. It is thereby possible to selectively decompose and remove the resin and the glass so as to form a fine through-hole and a fine inner via hole in a short time. If internal-layer copper foil is previously stacked in a machined portion, the decomposition and the removal of the insulating base material are terminated at the internal-layer copper foil. It is thereby possible to form a blind via hole which can surely be terminated at bottom copper foil. There is an advantage of no wear of the tool such as breakage because the laser beam machining methods are contactless machining methods.

The above laser beam machining methods employ a pulse laser such as the eximer laser and a TEA-carbonic acid gas laser, with an extremely narrow pulse width of 1 $\mu$s or less. The pulse laser can finely divide into chips (1) a single base material made of high polymeric material such as polyimide, or epoxy, (2) a composite material reinforced by aramid fiber or the like, containing the polyimide, the epoxy, and so forth, and (3) an inorganic material such as glass. It is thereby possible to rapidly and accurately form a good machined hole with a smooth machined portion and less altered layer in a printed board in which as the insulating base material is used composite material dispersed in the polyimide, the epoxy, and so forth.

The conventional laser beam machining method for the wiring board has the above structure. The eximer laser or the TEA-carbonic acid gas laser is used to provide the through-hole and the inner via hole in the most commonly used printed board having the insulating base material made of glass cloth containing the glass fiber and the resin, such as a glass epoxy printed board referred to as FR-4 made of the glass cloth and epoxy resin. In this case, there are problems in that metallic deposit for conduction can not easily be coated on a hole inner wall due to the extremely rough inner wall of the hole, and reliability of the metallic deposit can not be ensured. The problems are generated because the insulating material of the printed board is not only the composite material made of organic material and inorganic material but also heterogeneous material in which the organic material and the inorganic material are contained in clusters to some extent.

Further, there is another problem in that a uniform machined hole can not be provided due to differences in, for example, absorption coefficient of the laser beam, decomposition temperature, and thermal diffusivity between an organic material portion and an inorganic material portion. For example, since a wavelength of the laser beam in the eximer laser can not easily be absorbed by the glass, sufficient energy for decomposition of the glass can not be supplied so that a glass portion is difficult to remove, resulting in a problem of a rough machined hole. On the other hand, both the resin and glass can show high absorption coefficient in case of the TEA-carbonic acid gas laser. However, when energy density of 20 J/cm$^2$ required to efficiently machine glass epoxy material is obtained in the TEA-carbonic acid gas laser, excessively high power density of $2 \times 10^7$ W/cm$^2$ or more is caused due to the narrow pulse width of 1 $\mu$s or less. Such high power density may easily cause plasma at the machined portion. Once the plasma is formed, laser energy is absorbed by the plasma, resulting in insufficient energy reaching the machined portion. Hence, it is difficult to remove glass having a high decomposition temperature, thereby causing a problem of the rough machined hole.

If the energy density is set to cause no plasma, the machining progresses extremely slowly, resulting in a problem of a reduction in productivity.

In addition, only when a beam diameter is larger than the machined portion, good machining may be made to the materials (1), (2), and (3) in the conventional laser beam machining method. Otherwise, if the machined portion is larger than the beam diameter, for example, in case of cutting, grooving, and drilling for a large diameter hole, a removed material caused at a beam irradiated portion adheres to a position other than the beam irradiated portion. As a result, after the machining, the machined portion is coated with additionally deposited soot, thereby reducing reliability of insulation and reliability of metallic deposit in the printed board. Hence, there is another problem of the need for the step of, for example, complicated after-treatment such as wet etching.

Other than the extremely short pulse laser such as the eximer laser and the TEA-carbonic acid gas laser, there are other laser beam machining methods for the wiring board, using a typical carbonic acid gas laser of high-speed axial-flow type or three-axes orthogonal type in the prior art. In the conventional carbonic acid gas lasers, more importance is given to a CW output characteristic than a pulse output characteristic to enhance oscillation efficiency. That is, there is in theory a problem of pulse response sensitivity at a time of pulse oscillation, in particular, a characteristic in which a time is required for a fall of a laser pulse. Thus, the machining by the conventional carbonic acid gas laser having such a characteristic results in irradiation of the machined portion with a laser beam for a longer time, thereby causing a gradual temperature gradient around the machined portion. As a result, as shown in FIG. 34, a larger difference is caused in amount of removal between the resin and the glass due to a difference in decomposition temperature therebetween. When only the resin is excessively removed, there are problems in that projection of the glass fibers results in a rough machined hole as shown in FIG. 35, and the long heating time generates a char layer on a wall surface of the hole.

Further, carbides are generated around the machined portion, and the laser beam is absorbed by the copper through the carbides, resulting in frequent damage to the copper foil as shown in FIG. 36. Hence, there is a problem in that the blind via hole is difficult to form in the above laser beam machining methods.

Though descriptions have been given of the machining for the hole, the same problems are caused in the grooving and the cutting.

SUMMARY OF THE INVENTION

In order to overcome the above problems, it is an object of the present invention to provide a stable laser beam machining method for a wiring board, in which a printed board with an insulating base material containing cloth-like glass fibers can rapidly and accurately be machined, for example, drilled for a through-hole, an inner via hole and a blind via hole, grooved, or cut for an outside shape without roughness of a machined portion and the need for complicated after-treatment of additional deposit, and no damage is caused to copper foil. It is also an object of the present invention to provide a laser beam machining apparatus for a wiring board, for realizing the laser beam machining method for the wiring board and improving productivity.

It is another object of the present invention to provide a carbonic acid gas laser oscillator for machining a wiring board, which can output a laser beam with a pulse width most suitable for the laser beam machining method for the wiring board.

According to one aspect of the present invention, for achieving the above-mentioned objects, there is provided a laser beam machining method for a wiring board, including the step of irradiating a machined portion of the wiring board with a pulsed laser beam for a beam irradiation time ranging from 10 to 200 $\mu$s and with energy density of 20 J/cm$^2$ or more.

According to another aspect of the present invention, there is provided a laser beam machining method for a wiring board, including the step of irradiating the same machined portion of the wiring board with a pulsed laser beam with intervals of a beam irradiation pausing time of 15 ms or more and energy density of 20 J/cm$^2$ or more.

According to still another aspect of the present invention, there is provided a laser beam machining method for a wiring board, including the steps of combining into one pulse group laser beams including a plurality of pulses having energy density of 20 J/cm$^2$ or more and generated at intervals of a predetermined beam irradiation pausing time, and irradiating the same machined portion of the wiring board with a pulsed laser beam with the plurality of pulse groups respectively including the plurality of pulses at intervals of a pulse group interval irradiation pausing time longer than the predetermined beam irradiation pausing time. Preferably, the predetermined beam irradiation pausing time is 4 ms or more, the number of pulses in the pulse group is 4 or less, and the pulse group interval irradiation pausing time exceeds 20 ms.

According to a further aspect of the present invention, there is provided a laser beam machining method for a wiring board, including the step of, at a time of scanning a surface of the wiring board while irradiating a machined portion of the wiring board with the pulsed laser beam, scanning by a laser beam such that the machined portion is not continuously irradiated with the laser beam over 4 pulses at intervals of a beam irradiation pausing time less than 15 ms.

According to a still further aspect of the present invention, there is provided a laser beam machining method for a wiring board, including the steps of providing a 1 mm beam diameter on a surface of a machined portion, and scanning a surface of the wiring board at a scanning speed ranging from 8 to 6 m/min while irradiating the machined portion with a laser beam for a beam irradiation time ranging from 10 to 200 $\mu$s and at intervals of a beam irradiation pausing time of 2.5 ms.

According to another aspect of the present invention, there is provided a laser beam machining method for a wiring board, including the steps of setting a laser beam to have a square spot effective in machining of a machined portion of the wiring board, and scanning a surface of the wiring board while irradiating the machined portion of the wiring board with the pulsed laser beam. Preferably, the square spot of the laser beam on the machined portion is set to have a size of 0.9 mm×0.9 mm, and the surface of the wiring board is scanned with a scanning speed of 6 m/min and a scanning pitch is 200 $\mu$m while the machined portion being irradiated with the laser beam for a beam irradiation time ranging from 10 to 200 $\mu$s and at intervals of a beam irradiation pausing time of 1.25 ms.

According to a further aspect of the present invention, there is provided a laser beam machining method for a wiring board, including the steps of previously removing a metallic layer on the wiring board at a portion corresponding to a machined portion of the wiring board, forming a base material removed portion through machining by irradiating a base material of the machined portion with a laser beam through the metallic layer removed portion, and additionally irradiating the base material removed portion and a periphery of the base material removed portion, or only the periphery of the base material removed portion with a laser beam. Preferably, the additionally irradiated laser beam has a smaller peak output than a peak output of the first laser beam, and is used to scan at a higher scanning speed than a scanning speed during first laser beam irradiation.

According to a further aspect of the present invention, there is provided a laser beam machining method for a wiring board, including the step of, at a time of previously removing a metallic layer on the wiring board at a portion corresponding to a machined portion, partially removing the metallic layer such that a laser beam can reach only an outer periphery of a base material removed portion to be formed by irradiating a base material of the machined portion with the laser beam. Preferably, a surface of the wiring board is scanned with a scanning speed of 8 m/min and a scanning pitch of 100 $\mu$m while the machined portion being irradiated with the laser beam for a beam irradiation time ranging from 10 to 200 $\mu$s and at intervals of a beam irradiation pausing time of 2.5 ms.

According to a further aspect of the present invention, there is provided a laser beam machining method for a wiring board, including the steps of previously removing a metallic layer on the wiring board at a portion corresponding to a machined portion of the wiring board, and flowing a gas in a direction from a laser beam scanning start point to a laser beam scanning end point in the machined portion at a time of machining by irradiating a base material of the machined portion with a laser beam while scanning by the laser beam a through the metallic layer removed portion.

According to a further aspect of the present invention, there is provided a laser beam machining method for a wiring board, including the steps of forming a metallic layer having a desired shape by partially removing the metallic layer by pulse irradiation with a laser beam having sufficient intensity to melt and remove the metallic layer on the wiring board, and additionally irradiating a machined portion of the wiring board through a metallic layer removed portion with the laser beam having insufficient intensity to melt the metallic layer and a beam irradiation time ranging from 10 to 200 $\mu$s, and including a plurality of pulses forming a train at intervals of a beam irradiation pausing time of 15 ms or more. Preferably, the machined portion is exposed by previously removing, through another machining method such as etching, the metallic layer positioned at a target position for laser beam irradiation and in the range smaller than a shape to be machined. Further, surface roughening may previously be made to a surface of the metallic layer on a surface of the wiring board before the laser beam irradiation.

According to a further aspect of the present invention, there is provided a laser beam machining method for a wiring board, including the step of, at a time of pulse irradiation with a laser beam while sequentially positioning a spot of the laser beam at target positions on the wiring board in synchronization with a pulse frequency of the laser beam, providing a time interval of 15 ms or more between two optional successive pulsed laser beams for irradiation of the respective target positions irrespective of the pulse frequency by irradiating another target position with a pulsed laser beam outputted for the time interval therebetween.

According to a further aspect of the present invention, there is provided a laser beam machining method for a wiring board, including the steps of providing a plurality of machining stations on which the wiring boards to be machined are mounted, sequentially dividing a pulsed laser beam outputted from a laser oscillator among the plurality of machining stations for each pulse, and introducing the pulsed laser beam into the plurality of machining stations at time intervals of 15 ms or more. Preferably, a carbonic acid gas laser is used as a light source of the laser beam. The wiring board may contain glass cloth.

According to a further aspect of the present invention, there is provided a laser beam machining apparatus for a wiring board, including an optical mechanism to change a direction of a laser beam and move the laser beam on the wiring board while sequentially positioning a spot of the laser beam at target positions on the wiring board, and a control mechanism for synchronous control between a pulse oscillating operation of a laser oscillator and an operation of the optical mechanism, and control of the optical mechanism such that a time interval can be set to 15 ms or more between two optional successive pulsed laser beams for irradiation of the target positions irrespective of a pulse frequency of the laser oscillator.

According to a further aspect of the present invention, there is provided a laser beam machining apparatus for a wiring board, including an optical mechanism to sequentially divide a pulsed laser beam outputted from a laser oscillator among a plurality of machining stations for each pulse and introduce the pulsed laser beam into the plurality of machining stations for each pulse at time intervals of 15 ms or more, and a synchronization control mechanism for synchronous control between a dividing operation of the optical mechanism and a pulse oscillating operation of the laser oscillator. Preferably, the optical mechanism is provided with at least one rotary chopper rotated at a predetermined speed of rotation, having a plurality of reflection surfaces and a plurality of passing portions at positions equally dividing a periphery about an axis in a plane perpendicular to the rotation axis. Further, the synchronization control mechanism is provided with a trigger generating apparatus to generate a trigger each time all the equally divided areas including the plurality of reflection surfaces and the plurality of passing portions in the rotary chopper respectively move across an optical axis of the laser beam.

According to a further aspect of the present invention, there is provided a carbonic acid gas laser oscillator for machining a wiring board, in which a length of a discharge space in a gas flow direction is equal to or more than a width of an aperture, an optical axis passing through a center of the aperture is set to be positioned in the range that an entire area of the aperture does not extend off an area extending in the gas flow direction of the discharge space and on the farthest upstream side of the gas flow, and a rise time and a fall time are set to 50 $\mu$s or less in discharge power fed to the discharge space.

The above and further objects and novel features of the invention will more fully appear from the following detailed description when the same is read in connection with the accompanying drawings. It is to be expressly understood, however, that the drawings are for purpose of illustration only and are not intended as a definition of the limits of the invention.

BRIEF DESCRIPTION OF THE DRAWINGS

FIG. 16($b$) is an explanatory view showing a superimposed portion of beam irradiated portions in case of circular beam scanning;

FIG. 19($b$) is a plan view showing a machined shape of a copper foil removed portion in which copper foil is removed over an entire machined portion;

DETAILED DESCRIPTION OF THE PREFERRED EMBODIMENTS

A description will now be given of preferred embodiments of the present invention.

Embodiment 1

Figure 1:
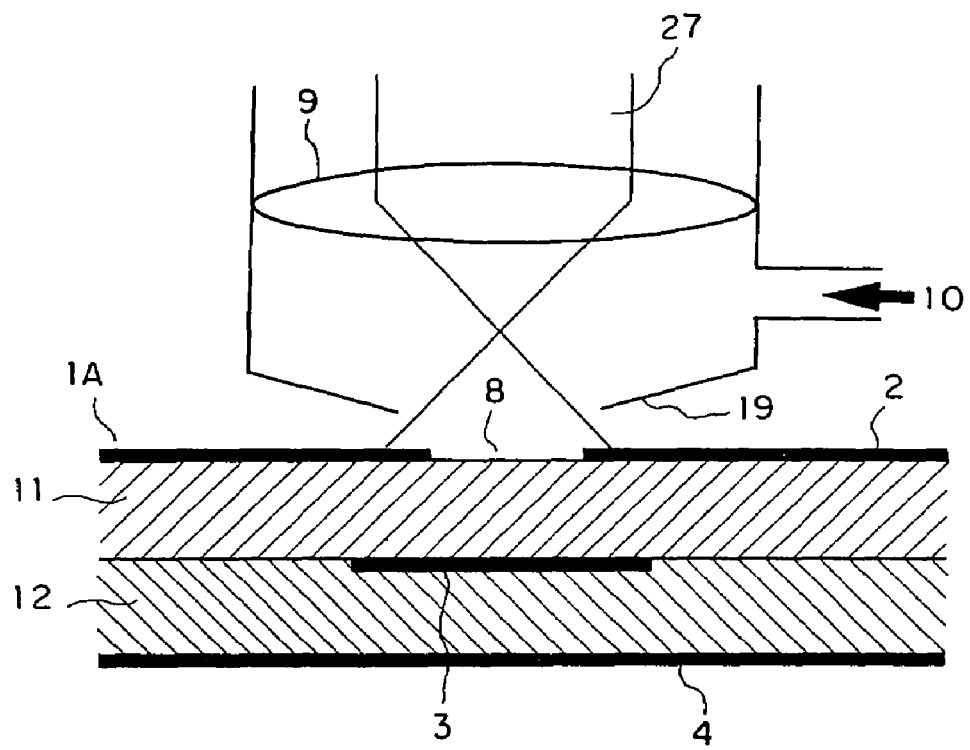
FIG. 1 is a typical diagram illustrating a laser beam machining method for a wiring board according to the embodiment 1 of the present invention.

FIG. 1 is a typical diagram showing a laser beam machining method for a wiring board according to the embodiment 1 of the present invention. In the drawing, reference numeral 1A means a printed board (wiring board), 2, 3, and 4 are conductor layers (metallic layers) including copper foil, 8 is a copper foil removed portion formed in the top conductor layer 2 by etching, 9 is a ZnSe lens for convergence of a laser beam 27 radiated from a carbonic acid gas laser, and 10 is an assist gas for lens protection. Air is employed in the embodiment as the assist gas 10. Reference numerals 11 and 12 are insulating base materials, and 19 is a gas nozzle through which the assist gas 10 is ejected. Here, the copper foil removed portion 8 is formed in the conductor layer 2 at a portion corresponding to a machined portion of the insulating base material 11.

In the embodiment 1, a three-layer glass epoxy printed board (FR-4) with both sides coated with copper foil and a thickness of 200 $\mu$m is used as the multi-layer printed board 1A. Further, the copper foil has a thickness of 18 $\mu$m in the conductor layers 2, 3, and 4, and the copper foil removed portion 8 with a diameter of 200 $\mu$m is formed in the top conductor layer 2 by the etching.

A description will now be given of the operation.

Figure 2:
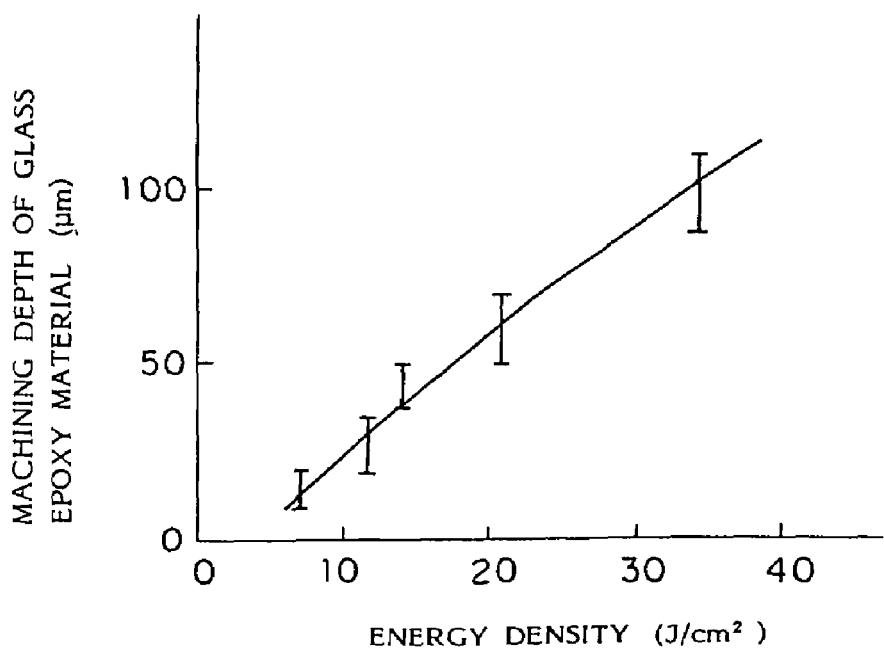
FIG. 2 is a graph diagram showing a relationship between energy density of a laser beam and a machining depth of a glass epoxy material in the laser beam machining method for the wiring board according to the embodiment 1 of the present invention.

FIG. 2 is a graph diagram showing the result of machining in which the carbonic acid gas laser is used as a light source, and energy per pulse is varied in the laser beam 27 therefrom, thereby varying energy density in the range from 7 to 35 J/cm$^2$ at the copper foil removed portion 8 corresponding to the machined portion of the printed board 1A, and irradiating an exposed portion of the insulating base material 11 with only one pulse through the copper foil removed portion 8. In the graph, the transverse axis defines energy density (J/cm$^2$), and the ordinate axis defines a machining depth ($\mu$m) of a glass epoxy material. As is apparent from FIG. 2, a variation in energy density per pulse of the laser beam 27 varies the machining depth of the printed board 1A made of the glass epoxy material. If the energy density is 20 J/cm$^2$ or less, machining is carried out with a negligible amount of removal. Thus, it is necessary to irradiate with a lot of pulses so as to pass through the glass epoxy material with a thickness of 100 $\mu$m. In view of productivity, a through-hole should be formed by several pulses per hole. Therefore, from the result of experiment shown in FIG. 2, it can be seen that high-speed and efficient machining requires irradiation with the laser beam 27 with the energy density of 20 J/cm$^2$ or more.

Figure 3:
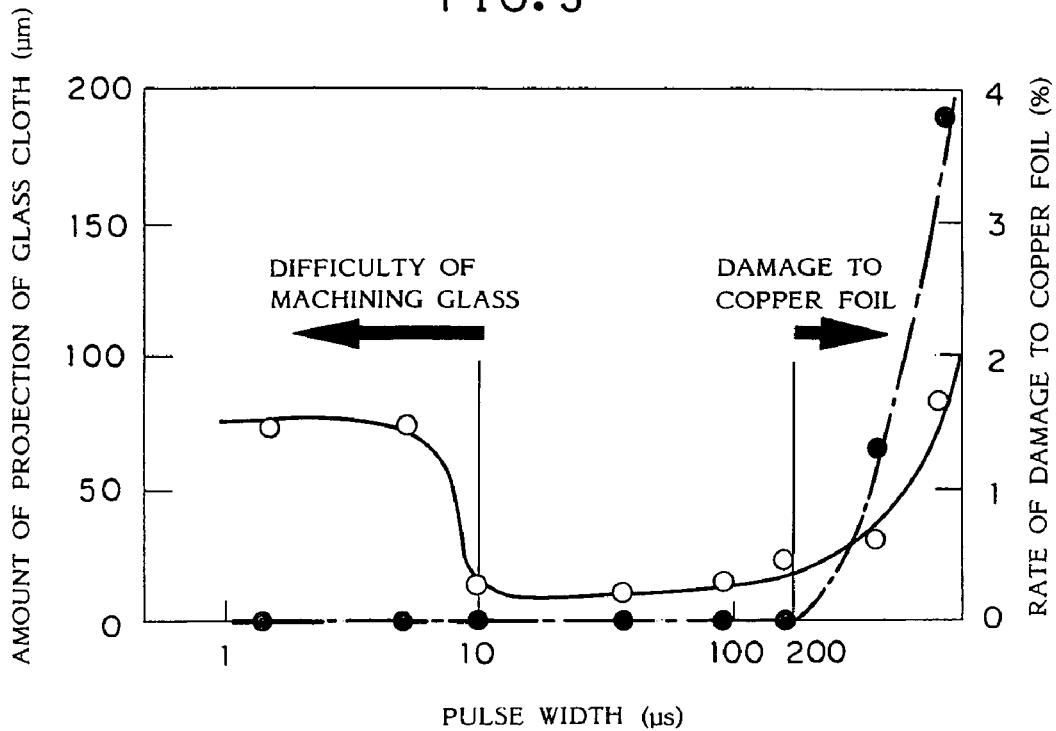
FIG. 3 is a graph diagram showing a variation in amount of projection of glass cloth at a machined portion and a variation in rate of damage to copper foil when a pulse width is varied in the laser beam machining method for the wiring board according to the embodiment 1 of the present invention.

FIG. 3 is a graph diagram showing the result of machining in which the laser beam 27 per pulse has constant energy density of 200 mJ, the laser beam 27 is condensed through the ZnSe lens 9 so as to provide a beam diameter of 500 $\mu$m on a surface of the machined portion of the printed board 1A, and set energy density to 100 J/cm$^2$, and the copper foil removed portion 8 is irradiated with only one pulse with a pulse width varying in the range of 1 to 500 $\mu$s. In the drawing, the transverse axis defines the pulse width ($\mu$s), and the ordinate axes define an amount of projection ($\mu$m) of glass cloth and a ratio (%) of damage to the copper foil. In this case, the air was used as the assist gas 10 for lens protection, and was supplied to the machined portion through the gas nozzle 19 at a flow rate of 10 1/min.

Figure 35:
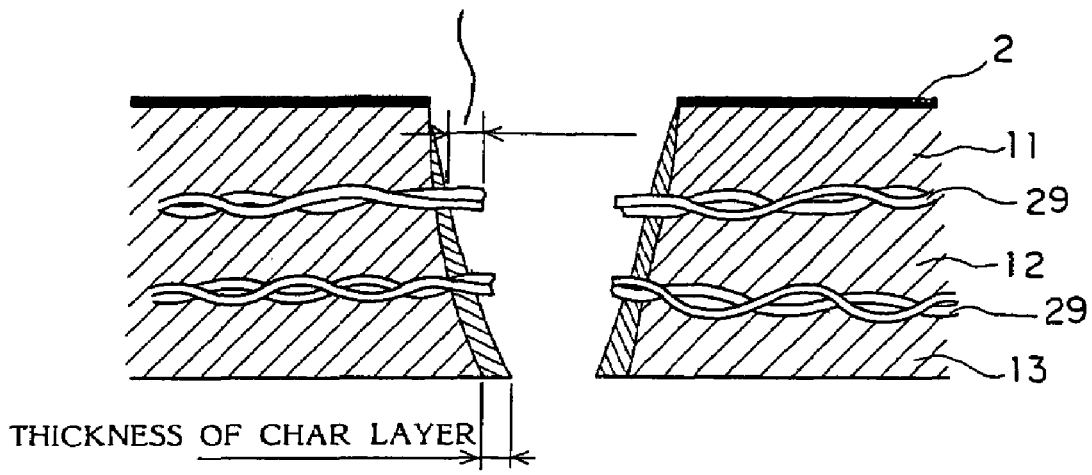
FIG. 35 is a sectional view of a machined portion, showing projection of glass cloth and a thickness of a char layer in the conventional laser beam machining method for the wiring board.
Figure 36:
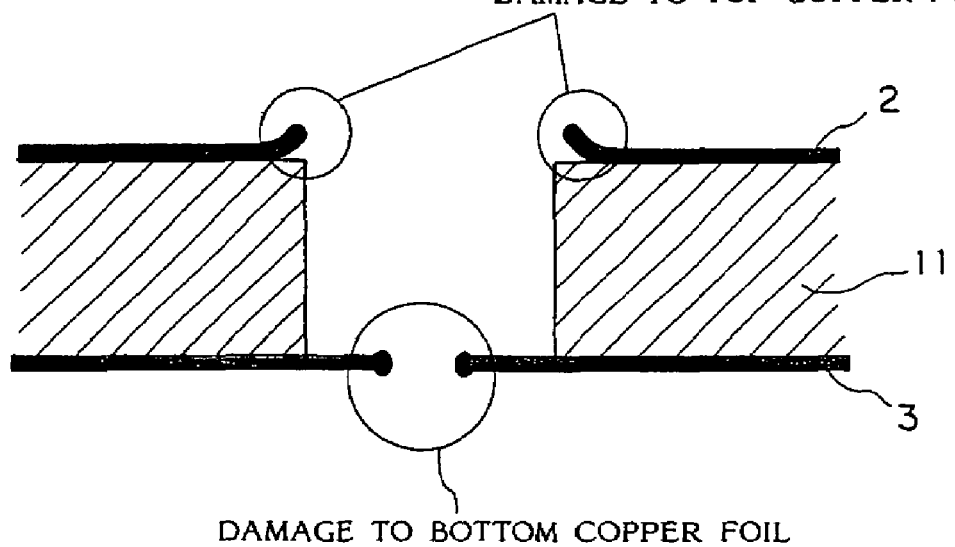
FIG. 36 is a sectional view of a machined portion, showing damage to copper foil in the conventional laser beam machining method for the wiring board.

It is possible to check the amount of projection of the glass cloth in a machined hole (or the base material removed portion) at a time of varying the pulse width of the laser beam 27, by observing a section of the machined hole through a microscope as shown in FIG. 35. In FIG. 3, variations in maximum value of the amount of projection of the glass cloth and in ratio of damage to the copper foil are plotted versus a variation in pulse width ranging from 1 to 500 $\mu$s. The ratio of damage to the copper foil is expressed as a percentage by using the number of machined holes passing through the conductor layer 3 serving as the bottom copper foil among 1,000 machined holes. As shown in FIG.

3, when the pulse width of the laser beam 27 is set in the range from 10 to 200 µs, it is possible to provide a machined hole with a little amount of projection of the glass cloth, and no damage to the bottom copper foil. In such a manner, by setting a beam irradiation time to 200 µs or less, it is possible to provide a sharp temperature gradient of a machined portion during machining (hereinafter, the machined portion as used herein meaning, for example, the machined hole during or after the machining) in the printed board 1A in the range from a surface of the machined portion to an inside portion. Further, it is possible to reduce the amount of projection of the glass cloth to a substantially negligible extent. In addition, since an amount of generating carbides is reduced, the damage to the copper foil can be reduced, and a blind via hole can stably be formed.

After ultrasonic cleaning and desmearing of the obtained machined hole, the machined hole was plated with copper, and a pattern was formed, thereafter observing the section of the hole. It came clear that plasma was caused at the machined portion during the laser beam machining when the laser beam 27 had a pulse width less than 10 µs, and the glass cloth was not completely removed due to the plasma. As a result, the bottom copper foil was not completely conductive in spite of the plating so that the many machined holes could not serve as a through-hole. On the other hand, when the laser beam 27 had a pulse width in the range from 10 to 200 µs, it was possible to provide a good through-hole in which all copper foil including the bottom copper foil were completely conductive through the plating. For comparison, though the same machining was carried out by using a diamond drill with a diameter of 200 µm, it was difficult to control a depth. That is, 10% of the 1,000 machined holes passed through the conductor layer 4 serving as bottom copper foil so that the conductor layer 3 and the conductor layer 4 were short-circuited. As described above, through the drill machining, it was difficult to provide an effect identical with that achieved by the laser beam machining method for the wiring board according to the embodiment 1.

As set forth above, according to the embodiment 1, at a time of irradiating the machined portion with the laser beam 27 having energy density of 20 J/cm$^2$ or more required for efficient machining of the printed board 1A made of the glass epoxy material containing the glass cloth and the epoxy resin, the beam irradiation time is appropriately set in the range from 10 to 200 µs. Since it is thereby possible to reduce power density to $2 \times 10^6$ W/cm$^2$ or less, the machining can be carried out without the plasma generating at the machined portion. Further, by setting the beam irradiation time to 200 µs or less, it is possible to provide the sharp temperature gradient of the machined portion during machining in the printed board 1A in the range from the surface of the machined portion to the inside portion. Further, it is possible to reduce the amount of projection of the glass cloth to the substantially negligible extent. In addition, since the amount of generating carbides can be reduced, the damage to the copper foil can be reduced, and the blind via hole can stably be formed.

Embodiment 2

Figure 5:
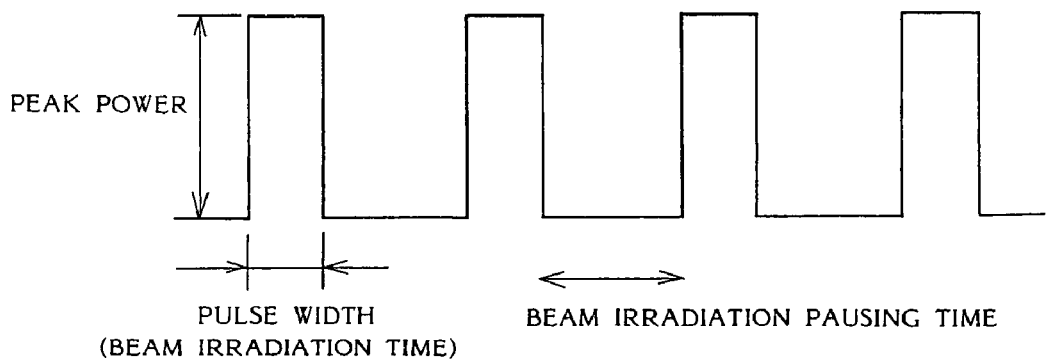
FIG. 5 is a waveform diagram showing an irradiation pattern of a laser beam in the laser beam machining method for the wiring board according to the embodiment 2 of the present invention.
Figure 4:
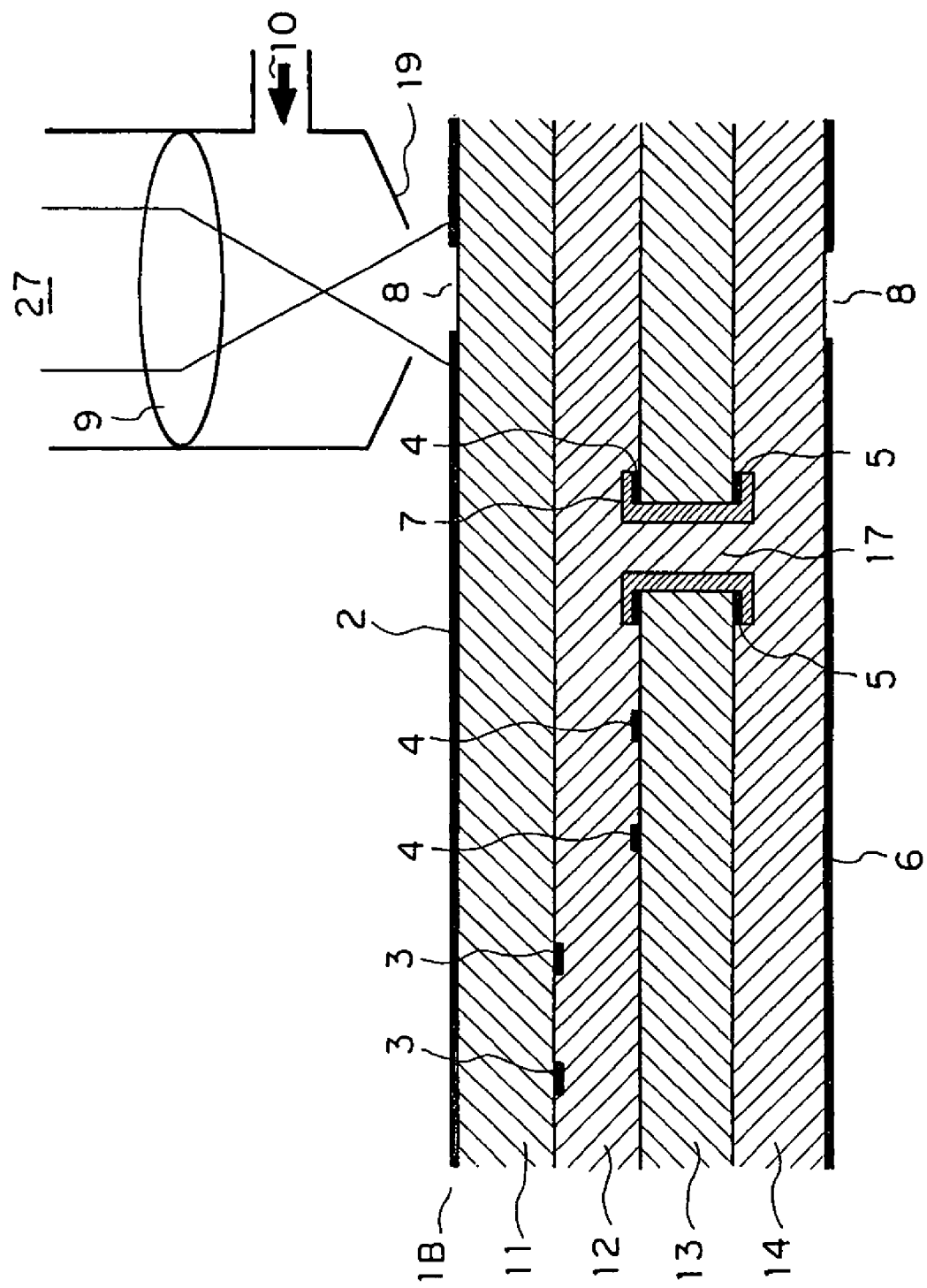
FIG. 4 is a typical diagram showing a laser beam machining method for a wiring board according to the embodiment 2 of the present invention.

FIG. 4 is a typical diagram showing a laser beam machining method for a wiring board according to the embodiment 2 of the present invention. In the drawing, the same reference numerals are used for component parts identical with those in FIG. 1, and descriptions thereof are omitted. Further, in FIG. 4, reference numeral 1B means a multi-layer printed board, 5 is a conductor layer, 6 is a conductor layer on a rear surface of the multi-layer printed board 1B, 7 is metal deposited on an inner surface of a through-hole 17, and 13 and 14 are insulating base materials. FIG. 5 is a waveform diagram showing an irradiation pattern of a laser beam 27 in the embodiment 2.

In the embodiment 2, a five-layer glass polyimide board with a thickness of 400 µm was used as the printed board 1B. In a top conductor layer 2 and a bottom conductor layer 6, copper foil had a thickness of 18 µm, and etching was made to form copper foil removed portions 8 with a diameter of 200 µm in the conductor layer 2 and the conductor layer 6 at positions corresponding to a conduction hole to be machined.

A description will now be given of the operation.

Figure 6:
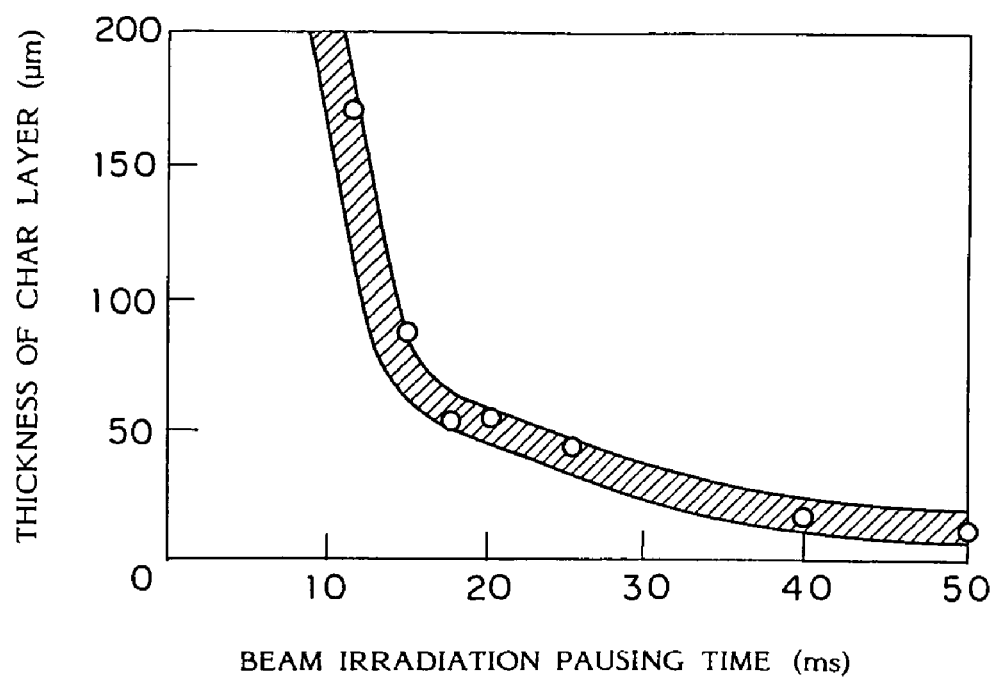
FIG. 6 is a graph diagram showing a variation in thickness of a char layer observed on the rear side of a machined hole immediately after machining when a beam irradiation pausing time is varied in the laser beam machining method for the wiring board according to the embodiment 2 of the present invention.

A carbonic acid gas laser with a pulse width of 50 µs and pulse energy of 280 mJ was condensed on the printed board 1B through a ZnSe lens 9 such that a laser beam diameter became 500 µm on a surface of the machined portion, thereby setting energy density to 143 J/cm$^2$. Further, a beam irradiation pausing time shown in FIG. 5 was varied in the range from 12.5 to 50 ms, and a portion of the insulating base material 11 exposed through the copper foil removed portion 8 was irradiated with the pulsed laser beam 27. At the time, air was used as an assist gas 10 for lens protection, and was supplied to the machined portion through a gas nozzle 19 at a flow rate of 10 1/min. FIG. 6 is a graph diagram showing a variation in thickness (µm) of a char layer observed on the rear side of the machined hole immediately after the machining when the beam irradiation pausing time is varied as described above. It is possible to check the thickness of the char layer by observing a section of the machined hole through a microscope as shown in FIG. 35.

As shown in FIG. 6, when the beam irradiation pausing time is below 15 ms, the thickness of the char layer rapidly increases. After the laser beam machining, the obtained printed board 1B was ultrasonically cleaned by pure water for three minutes. It was thereby possible to completely remove the char layer in case of the beam irradiation pausing time of 15 ms or more. After the ultrasonic cleaning and desmearing of the obtained machined hole, the machined hole was plated with copper, and a pattern was formed, thereafter observing the section. It was possible to provide a good through-hole having a diameter of 200 µm and a smooth inner wall in case of the beam irradiation pausing time of 15 ms or more. On the other hand, in case of the beam irradiation pausing time less than 15 ms, a residual char layer and projecting glass cloth were observed between a metallic deposit and a base material of the printed board 1B, the hole had a rough inner wall, and throwing power in plating was insufficient.

Figure 7:
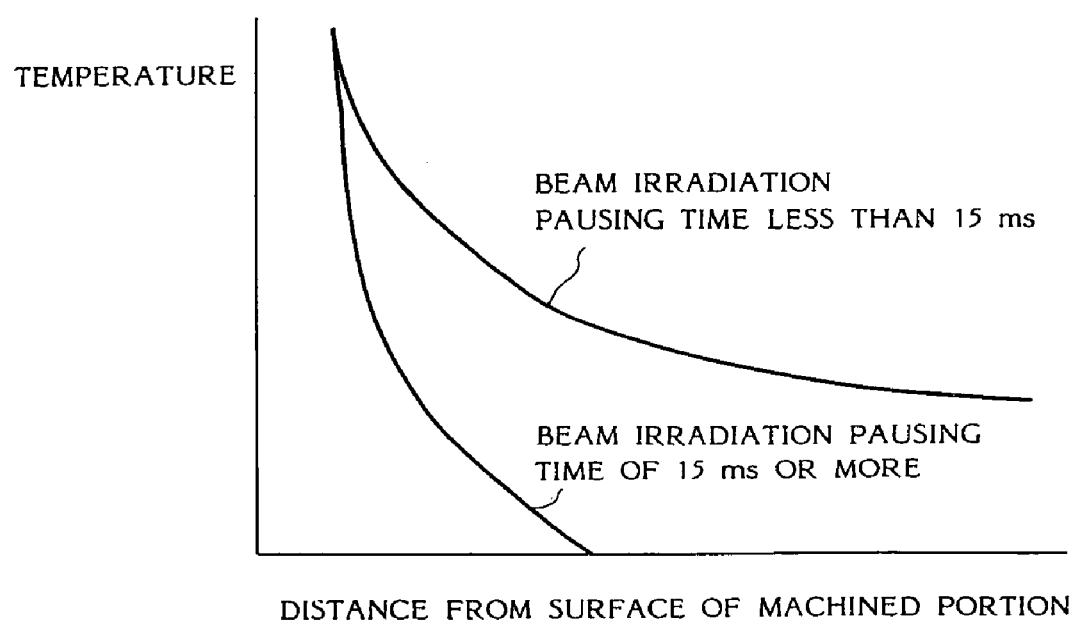
FIG. 7 is a machined portion temperature characteristic diagram showing a relationship between a distance from a surface of the machined portion and a temperature by using the beam irradiation pausing time as a parameter.

It can be considered that, as shown in FIG. 7, the above problems were caused because, in case of the beam irradiation pausing time less than 15 ms, a gradual temperature gradient was provided by machining according to a distance from a surface of the machined portion during the machining, and a temperature was excessively increased at a deep portion from the surface of the machined portion, at which a rise of the temperature was unnecessary. On the other hand, if the same beam irradiated portion is irradiated with the pulsed laser beam 27 with the beam irradiation pausing time of 15 ms or more, it is possible to ensure a cooling time required to completely cool the machined portion for each pulse. As shown in FIG. 7, in case of the beam irradiation pausing time of 15 ms or more, it is possible to reduce gradation of the temperature gradient caused due to the temperature rise at the machined portion during irradiation with the laser beam 27, and reduce the projection of the glass cloth.

As set forth above, the carbonic acid gas laser is used for multi-pulse irradiation at appropriate irradiation intervals. It is thereby possible to provide the conduction hole having a high aspect ratio which can not be obtained by a single pulse, and rapidly machine the printed board including the glass cloth with high accuracy.

For comparison, though the same machining was carried out by using a diamond drill with a diameter of 200 μm, the drill was worn out after machining for about 1,000 machined holes, resulting in the rough inner wall of the hole and occasional breakage of the drill. Hence, the method required a machining time about ten times a machining time in the laser beam machining method for the wiring board according to the embodiment 2.

As set forth above, according to the embodiment 2, since the same beam irradiated portion is irradiated with the pulsed laser beam at intervals of the beam irradiation pausing time of 15 ms or more, it is possible to ensure the cooling time required to completely cool the machined portion for each pulse. As shown in FIG. 7, it is possible to increase the temperature gradient of the machined portion, and reduce heating at the machined portion. As a result, it is possible to reduce the projection of the glass cloth, and rapidly machine the printed board containing the glass cloth with high accuracy even in case of multi-pulse irradiation.

Embodiment 3

Figure 8:
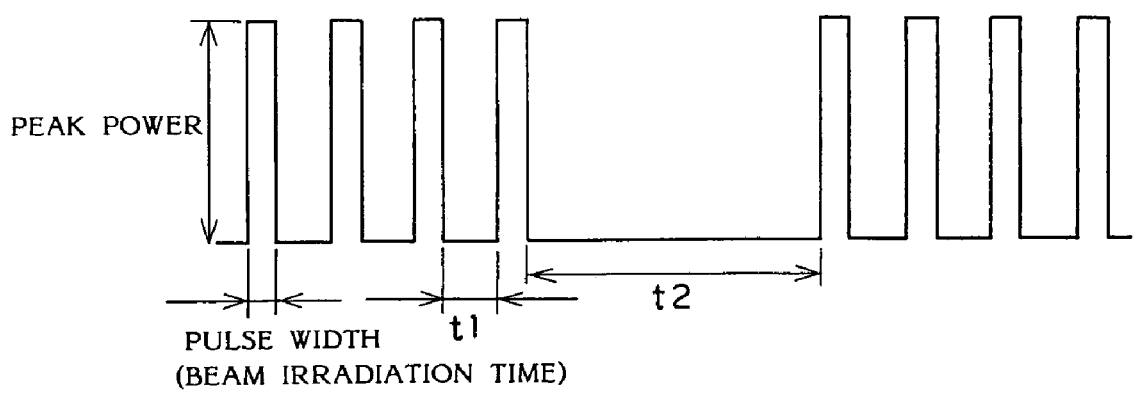
FIG. 8 is a waveform diagram showing an irradiation pattern of a laser beam in the embodiment 3 of the present invention.

FIG. 8 is a waveform diagram showing an irradiation pattern of a laser beam in a laser beam machining method for a wiring board according to the embodiment 3 of the present invention. In the embodiment 3, as shown in FIG. 4 of the embodiment 2, a five-layer glass polyimide board with a thickness of 400 μm was used as a printed board 1B. In a top conductor layer 2 and a bottom conductor layer 6, copper foil had a thickness of 18 μm, and etching was made to form copper foil removed portions 8 with a diameter of 200 μm in the conductor layer 2 and the conductor layer 6 at positions corresponding to a conduction hole to be machined.

A description will now be given of the operation.

A laser beam 27 was emitted from a carbonic acid gas laser with a constant pulse width of 50 μs, and constant pulse energy of 280 mJ. Further, the laser beam 27 was condensed on the printed board 1B through a ZnSe lens 9 such that a laser beam diameter became 500 μm on a surface of the machined portion, thereby setting energy density to 143 J/cm$^2$. As shown in FIG. 8, there were provided a plurality of pulse groups respectively including two to ten pulses with a beam irradiation pausing time of t1, and the printed board 1B was irradiated with the pulse groups for a pulse group interval beam irradiation pausing time of t2.

In the embodiment, the beam irradiation pausing time t1 was varied in the range from 0 to 10 ms, and the pulse group interval beam irradiation pausing time t2 was varied in the range from 50 to 10 ms. A portion of an insulating base material 11 exposed through the copper foil removed portion 8 was irradiated with 52 pulses. At the time, air was used as an assist gas 10 for lens protection, and was supplied to the machined portion through a gas nozzle 19 at a flow rate of 10 l/min.

Figure 9:
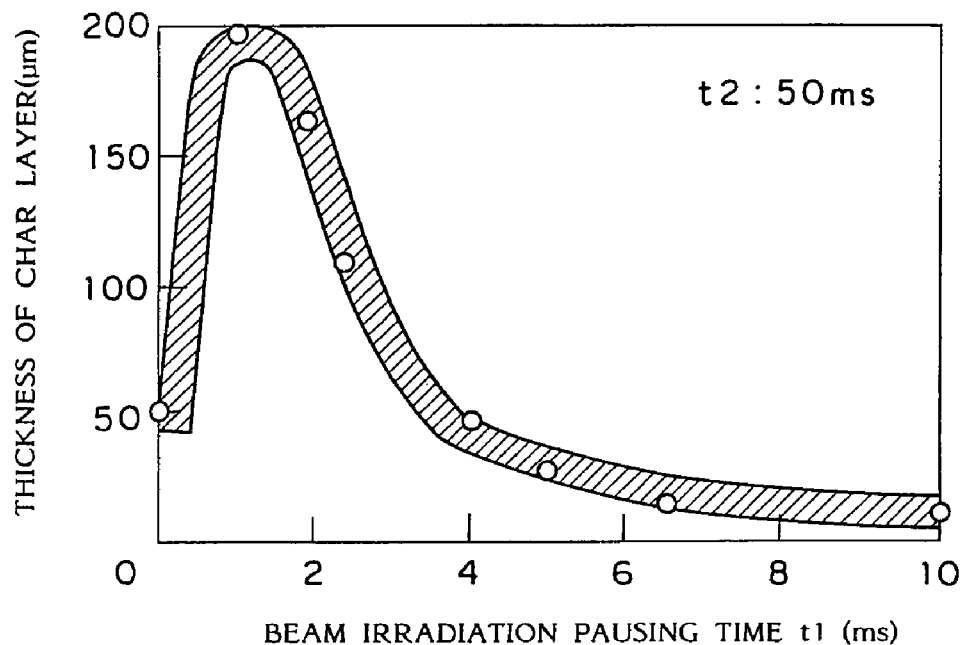
FIG. 9 is a graph diagram showing a variation in thickness of a char layer when a beam irradiation pausing time is varied between pulses among pulse groups in a laser beam machining method for a wiring board according to the embodiment 3 of the present invention.

FIG. 9 is a graph diagram showing a variation in thickness of a char layer observed on the rear side of a machined hole immediately after the machining when the beam irradiation pausing time t1 was varied between pulses among the pulse groups. In this case, the pulse group interval beam irradiation pausing time t2 was set to a sufficiently large value of 50 ms. As shown in FIG. 9, when the beam irradiation pausing time t1 was equal to or more than 4 ms, the thickness of the char layer became thinner than a thickness (ranging from 50 to about 100 μm) of the layer in case of the beam irradiation pausing time t1 of 0 ms. Thus, it can be seen that the variation in beam irradiation pausing time t1 can effectively reduce the thickness of the char layer.

Figure 10:
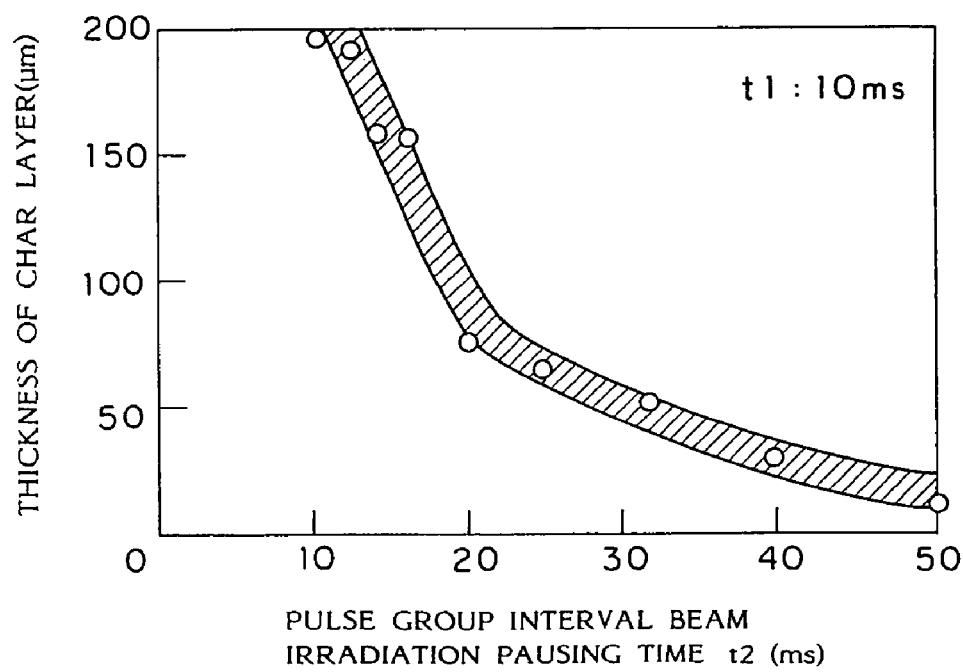
FIG. 10 is a graph diagram showing a variation in thickness of a char layer when a pulse group interval beam irradiation pausing time is varied in the laser beam machining method for the wiring board according to the embodiment 3 of the present invention.

FIG. 10 is a graph diagram showing a variation in thickness of a char layer observed on the rear side of a machined hole immediately after the machining when the pulse group interval beam irradiation pausing time t2 was varied from 50 to 10 ms. In this case, the number of pulses among the pulse groups was set to two, and the beam irradiation pausing time t1 was set to 10 ms. As shown in FIG. 10, when the pulse group interval beam irradiation pausing time t2 was 20 ms or less, the thickness of the char layer rapidly increased.

Figure 11:
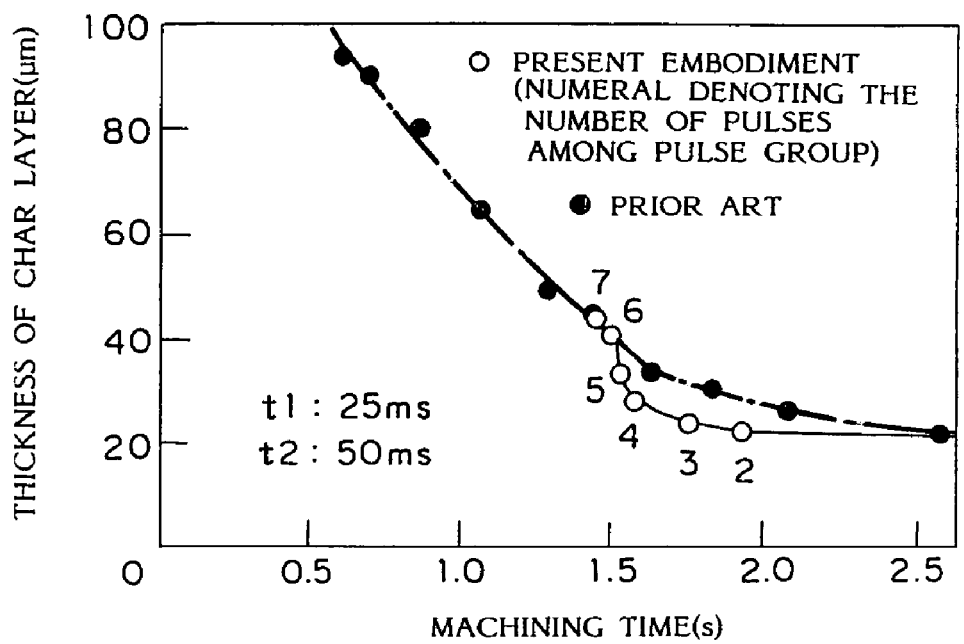
FIG. 11 is a graph diagram showing a variation in machining time required for drilling when the number of pulses among the pulse groups is varied in the laser beam machining method for the wiring board according to the embodiment 3 of the present invention.

FIG. 11 is a graph diagram showing a variation in thickness of a char layer observed on the rear side of a machined hole immediately after the machining with respect to a variation in machining time required for drilling when the number of pulses among the pulse groups was varied. At the time, the beam irradiation pausing interval t1 between the pulses was set to 25 ms, and the pulse group interval beam irradiation pausing time t2 was set to 50 ms. As shown in FIG. 11, when the number of pulses is 4 or less, with the same machining quality, it is possible to reduce about 6 to 22% of a machining time required for machining by a single pulse frequency.

After ultrasonic cleaning and desmearing of the obtained machined hole, the machined hole was plated with copper, and a pattern was formed, thereafter observing a section. When the beam irradiation pausing time t1 between pulses was 4 ms or more, the pulse group interval beam irradiation pausing time t2 was 20 ms or more, and the number of pulses in the pulse groups was 4 or less, it was possible to provide a good through-hole having a diameter of 200 μm and a smooth inner wall as in the case of the single pulse frequency. Further, in case of a thin-walled printed board, it was possible to provide a good through-hole even when the number of pulses among the pulse groups was 4 or more with satisfaction of the above conditions of the beam irradiation pausing time t1 and the pulse group interval beam irradiation pausing time t2. That is, it was possible to reduce the machining time by satisfying the conditions of the beam irradiation pausing time t1 and the pulse group interval beam irradiation pausing time t2 so as to appropriately select the number of pulses among the pulse groups according to a thickness of the printed board. Further, if the conditions of the beam irradiation pausing time t1 and the pulse group interval beam irradiation pausing time t2 were not met, a residual char layer and projecting glass cloth were observed between a metallic deposit and a base material of the printed board 1B, the hole had a rough inner wall, and throwing power in plating was insufficient.

As set forth above, according to the embodiment 3, the appropriate beam irradiation pausing time is provided, and the multi-pulse irradiation is carried out with the pulse groups including the several pulses. It is thereby possible to reduce the machining time to be less than that in case of the single pulse. At the same beam irradiated portion, the machined portion is irradiated with the pulsed laser beam having the plurality of pulse groups respectively including the plurality of pulses with intervals of the predetermined beam irradiation pausing time with intervals of the pulse group interval beam irradiation pausing time longer than the beam irradiation pausing time between the pulses. It is thereby possible to prevent a rise of a temperature at the machined portion, reduce gradation of the temperature gradient with respect to a depth distance from the surface of the machined portion, and reduce the projection of the glass cloth.

Embodiment 4

Figure 12:
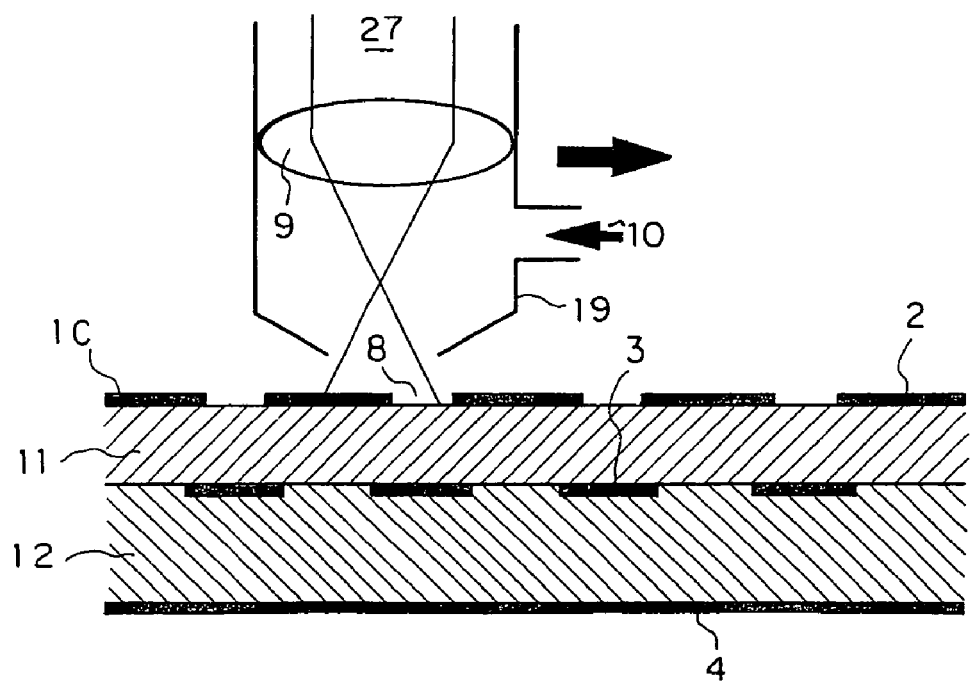
FIG. 12 is a typical diagram illustrating a laser beam machining method for a wiring board according to the embodiment 4 of the present invention.

FIG. 12 is a typical diagram illustrating a laser beam machining method for a wiring board according to the embodiment 4 of the present invention. In the drawing, the same reference numerals are used for component parts identical with or equivalent to those in FIG. 1, and descriptions thereof are omitted. In the embodiment, a three-layer glass epoxy printed board (FR-4) with a thickness of 500 μm was used as a multi-layer printed board 1C. Further, copper foil had a thickness of 18 μm in conductor layers 2, 3, and 4, a distance between the conductor layer 2 and the conductor layer 3 was 200 μm, and a copper foil removed portion 8 with a diameter of 200 μm was formed in the top conductor layer 2 by etching.

A description will now be given of the operation.

Figure 13:
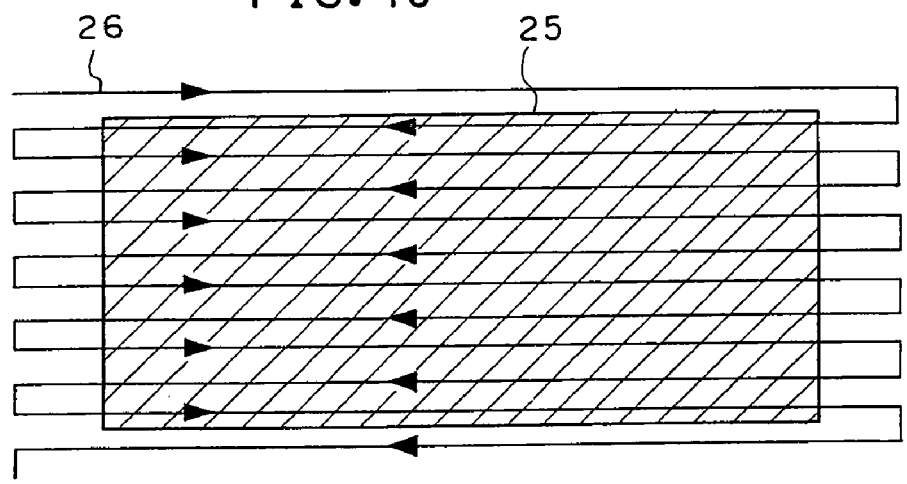
FIG. 13 is an explanatory view showing an existence region of a copper foil removed portion and a scanning path for raster scanning in the laser beam machining method for the wiring board according to the embodiment 4 of the present invention.

A laser beam 27 was emitted from a carbonic acid gas laser with constant pulse energy of 280 mJ, a constant pulse width of 50 μs and a constant pulse frequency of 400 Hz. Further, the laser beam 27 was condensed on the printed board 1C through a ZnSe lens 9 such that a laser beam diameter became 1 mm on a surface of a machined portion, thereby setting energy density to 35 J/cm². As shown in FIG. 13, a raster scanning was made on a path 26 with a scanning speed ranging from 8 to 3 m/min and a scanning pitch of 100 μm such that an entire existence region 25 of the copper foil removed portion 8 was irradiated with the laser beam 27. At the time, air was used as an assist gas 10 for lens protection, and was supplied to the machined portion through a gas nozzle 19 at a flow rate of 10 l/min.

Figure 14:
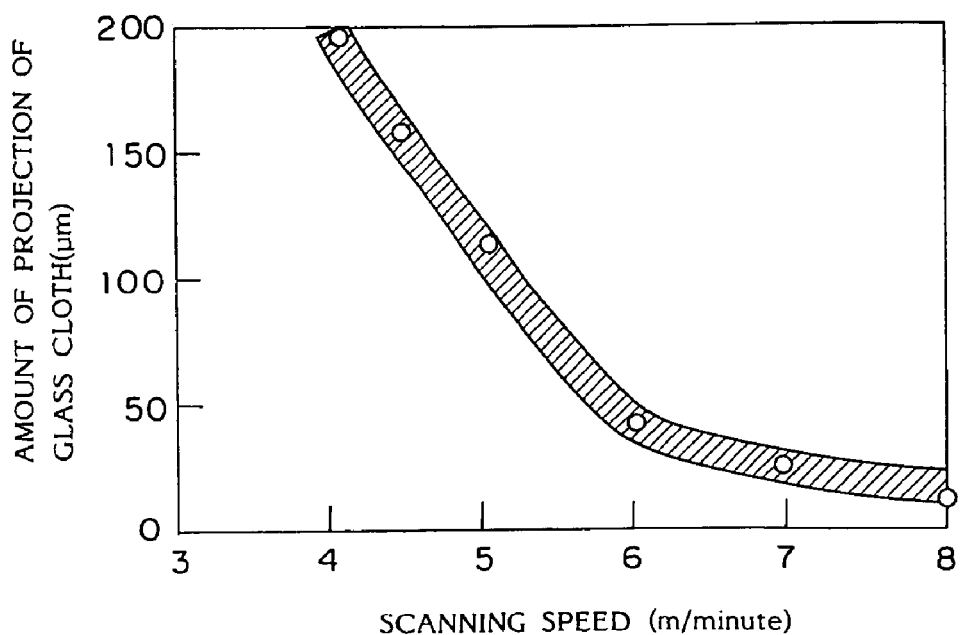
FIG. 14 is a graph diagram showing a variation in amount of projection of glass cloth at a machined portion when a scanning speed of a laser beam is varied in the laser beam machining method for the wiring board according to the embodiment 4 of the present invention.

FIG. 14 is a graph diagram showing a variation in amount of projection of glass cloth in a machined hole when the scanning speed of the laser beam 27 is varied. In the drawing, as the amount of projection of the glass cloth, the maximum value thereof is plotted. As shown in FIG. 14, when the scanning speed of the laser beam 27 is in the range of 8 to 6 m/min, it is possible to provide a machined hole with a small amount of projection of the glass cloth and no damage to bottom copper foil.

After ultrasonic cleaning and desmearing of the obtained machined hole, the machined hole was plated with copper, and a pattern was formed, thereafter observing a section. When the scanning speed of the laser beam 27 was 6 m/min or less, the amount of projection of the glass cloth became 20 μm or more due to heat, resulting in insufficient throwing power. As a result, there were observed many printed boards having plating solution soaking into the glass cloth. On the other hand, when the scanning speed of the laser beam 27 was in the range from 8 to 6 m/min, it was possible to highly efficiently provide a good conduction hole in which all the copper foil including the bottom copper foil were completely conductive through the plating.

As set forth above, according to the embodiment 4, it is possible to tremendously increase a machining speed while keeping the same machining quality as that of the same machining by positioning the laser beam 27 for each machined portion. Further, it is possible to reduce, for example, the projection of the glass cloth during the machining of the printed board, thereby enabling high quality machining such as drilling of a through-hole and a blind via hole, grooving, and cutting for an outside shape.

Embodiment 5

Figure 15:
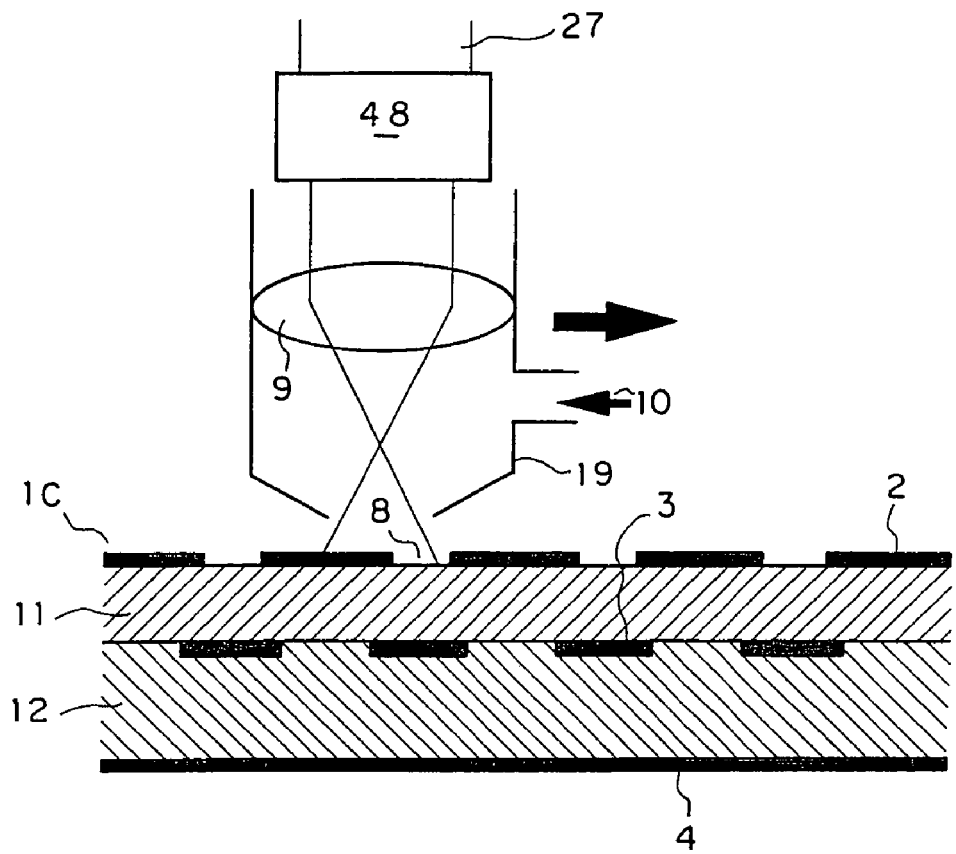
FIG. 15 is a typical diagram illustrating a laser beam machining method for a wiring board according to the embodiment 5 of the present invention.

FIG. 15 is a typical diagram illustrating a laser beam machining method for a wiring board according to the embodiment 5 of the present invention. In the drawing, the same reference numerals are used for component parts identical with those in FIG. 1, and descriptions thereof are omitted. Reference numeral 48 means a beam shaping optical system to shape a laser beam 27 through a kaleidoscope such that the laser beam 27 can have a beam spot size of 0.9 mm×0.9 mm on a surface of a machined portion.

In the embodiment 5, as in the embodiment 4, a three-layer glass epoxy printed board (FR-4) with a thickness of 500 μm was used as a printed board 1C. Further, copper foil had a thickness of 18 μm in conductor layers 2, 3, and 4, a distance between the conductor layer 2 and the conductor layer 3 was 200 μm, and a copper foil removed portion 8 with a diameter of 200 μm was formed in the top conductor layer 2 by etching.

A description will now be given of the operation.

A laser beam 27 was emitted from a carbonic acid gas laser with constant pulse energy of 280 mJ, a constant pulse width of 50 μs and a constant pulse frequency of 800 Hz. Further, the laser beam 27 was condensed on the multi-layer printed board 1C through a ZnSe lens 9 after shaping by using the beam shaping optical system 48 including the kaleidoscope such that the laser beam 27 had the beam spot size of 0.9 mm×0.9 mm on the surface of the machined portion, thereby setting energy density to 35 J/cm². As in the embodiment 4, a raster scanning was made with a scanning speed of 6 m/min and a scanning pitch of 200 μm such that an entire existence region of the copper foil removed portion 8 was irradiated with the laser beam 27. At the time, air was used as an assist gas 10 for lens protection, and was supplied to the machined portion through a gas nozzle 19 at a flow rate of 10 l/min. Further, for comparison, the same laser beam machining was made by a circular beam with the same energy density and a diameter of 1 mm.

Figure 16:
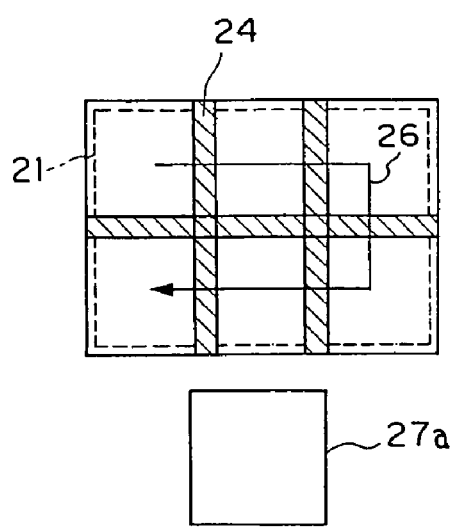
FIG. 16($a$) is an explanatory view showing a superimposed portion of beam irradiated portions in case of square beam scanning in the laser beam machining method for the wiring board according to the embodiment 5 of the present invention.
Figure 16:
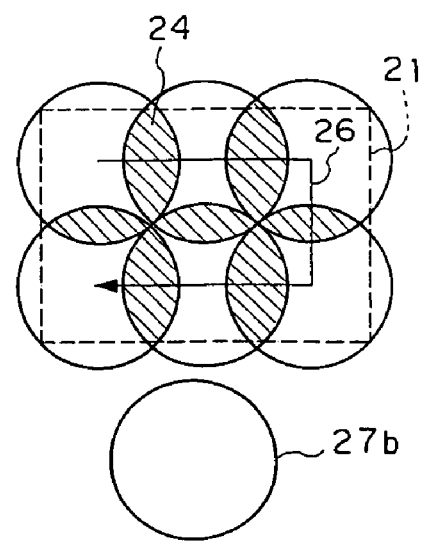

As a result, as shown in FIG. 16($a$), when a path 26 is scanned by a square laser beam 27$a$ having a square laser beam on a machined portion 21, it was possible to provide a machined hole with a small amount of projection of glass cloth and no damage to bottom copper foil. On the other hand, as shown in FIG. 16($b$), in case of a circular laser beam 27$b$, there were caused carbonization in the machined hole and breakage of the bottom copper foil.

This is because, as shown in FIGS. 16($a$) and 16($b$), a superimposed portion 24 of beam irradiated portions can more be reduced in scanning by the square laser beam 27$a$ having the square laser beam on the machined portion 21 of the printed board 1C than would be in scanning by the circular laser beam 27$b$. As a result, the square laser beam 27$a$ can decrease gradation of a temperature gradient generated according to a temperature rise at the machined portion, and can more reduce a lower limit of a beam irradiation pausing time than would be in the circular laser beam 27$b$. By scanning the surface of the printed board 1C by the pulse carbonic acid gas laser, it is possible to carry out the machining of the printed board 1C such as drilling for a through-hole and a blind via hole, grooving, and cutting for an outside shape at a more rapid machining speed than that in case of the circular laser beam 27$b$, resulting in the same machining quality.

After ultrasonic cleaning and desmearing of the obtained machined hole, the machined hole was plated with copper, and a pattern was formed, thereafter observing a section. In case of the circular laser beam 27$b$, the amount of projection of the glass cloth became 20 μm or more due to heat, resulting in insufficient throwing power. As a result, there were observed many printed boards having plating solution soaking into the glass cloth. On the other hand, in case of the square laser beam 27$a$, it was possible to provide a good conduction hole in which all the copper foil including the bottom copper foil were completely conductive through the plating.

As set forth above, according to the embodiment 5, the square laser beam is provided on the surface of the sample. It is thereby possible to provide a more rapid machining speed than that in case of the circular laser beam 27b while keeping good machining quality.

Embodiment 6

Figure 17:
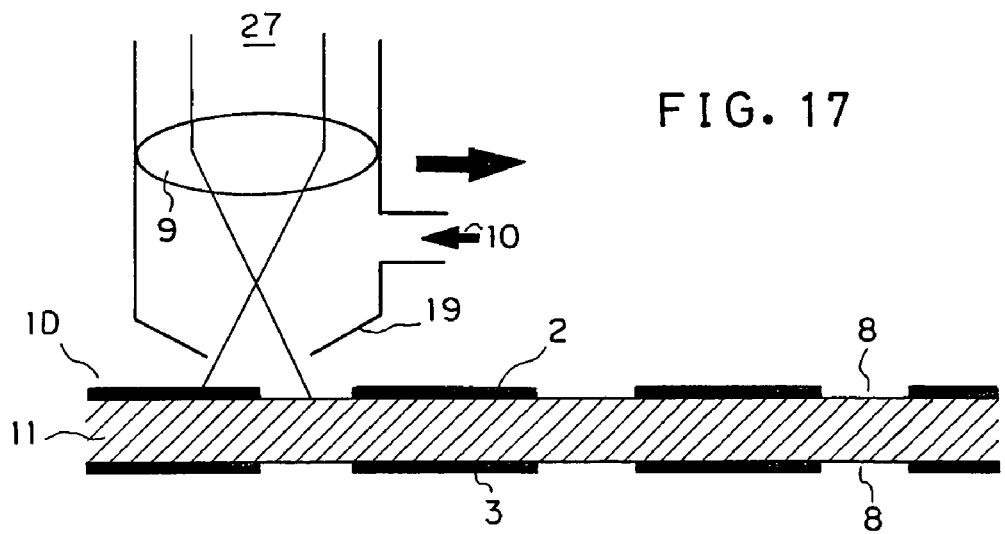
FIG. 17 is a typical diagram illustrating a laser beam machining method for a wiring board according to the embodiment 6 of the present invention.

FIG. 17 is a typical diagram illustrating a laser beam machining method for a wiring board according to the embodiment 6 of the present invention. In the drawing, the same reference numerals are used for component parts identical with those in FIG. 1, and descriptions thereof are omitted. Reference numeral 1D means a printed board, and a glass epoxy printed board (FR-4) with a thickness of 200 μm and both sides coated with copper is used as the printed board 1D. Copper foil has a thickness of 18 μm in conductor layers 2 and 3. Etching with a pitch of 10 mm is made to remove copper foil with a width of 1 mm and a length of 10 mm so as to form copper foil removed portions 8 in the top conductor layer 2 and the bottom conductor layer 3 in the printed board 1D at the same position.

A description will now be given of the operation.

According to the embodiment 6, a laser beam 27 was emitted from a carbonic acid gas laser with constant pulse energy of 280 mJ, a constant pulse width of 50 μs and a constant pulse frequency of 400 Hz. Further, the laser beam 27 was condensed on the printed board 1D through a ZnSe lens 9 such that the laser beam 27 had a beam diameter of 1 mm on a surface of a machined portion, thereby setting energy density to 35 J/cm$^2$. As shown in FIG. 13, a raster scanning was made with a scanning pitch of 100 μm and a scanning speed of 8 m/min such that an entire existence region 25 of the copper foil removed portion 8 was irradiated with the laser beam 27. At the time, air was used as an assist gas 10 for protection of the ZnSe lens 9, and was supplied to the machined portion through a gas nozzle 19 at a flow rate of 10 l/min. Though no glass cloth projected and no char layer was generated, there were rigid residual additionally deposited around the machined hole due to large volumes of removed base materials.

After the machining, the laser beam 27 was emitted from the carbonic acid gas laser with the constant pulse energy of 200 mJ, the constant pulse width of 50 μs and the constant pulse frequency of 400 Hz. Further, the laser beam 27 was condensed on the printed board 1D through the ZnSe lens 9 such that the laser beam 27 had the beam diameter of 1 mm on the surface of the machined portion, thereby setting the energy density to 25 J/cm$^2$. As in the above machining, a second raster scanning was made with a scanning speed of 10 m/min and a scanning pitch of 100 μm such that an entire existence region 25 of the copper foil removed portions 8 was irradiated with the laser beam 27. At the time, air was used as the assist gas 10 for protection of the ZnSe lens 9, and was supplied to the machined portion through the gas nozzle 19 at the flow rate of 10 l/min. This can substantially completely remove the additional deposits around the machined hole without damage to the top copper foil.

After ultrasonic cleaning and desmearing of the obtained machined hole, the machined hole was plated with copper, and a pattern was formed, thereafter observing a section. It was possible to provide a good slit which was completely conductive through the plating without the residual additional deposit around the machined hole.

As set forth above, according to the embodiment 6, after the base material is removed by beam irradiation, the machined hole and a periphery of the machined hole, or only the periphery of the machined hole is irradiated with the laser beam 27 once again to remove soot additionally deposited around the machined hole. The second beam irradiation is used to remove only the soot, resulting in a small amount of removal and no additionally deposited soot. Thereby, even when a portion to be machined is larger than the laser beam diameter, for example, even in case of cutting, grooving, or drilling for a large diameter hole, it is possible to remove the additional deposits without the step for complicated after-treatment such as wet etching to remove the additionally deposited soot serving as the residual in the machined hole after the machining. As a result, it is possible to avoid a reduction in reliability of insulation and reliability of metallic deposit in the printed board.

Embodiment 7

Figure 18:
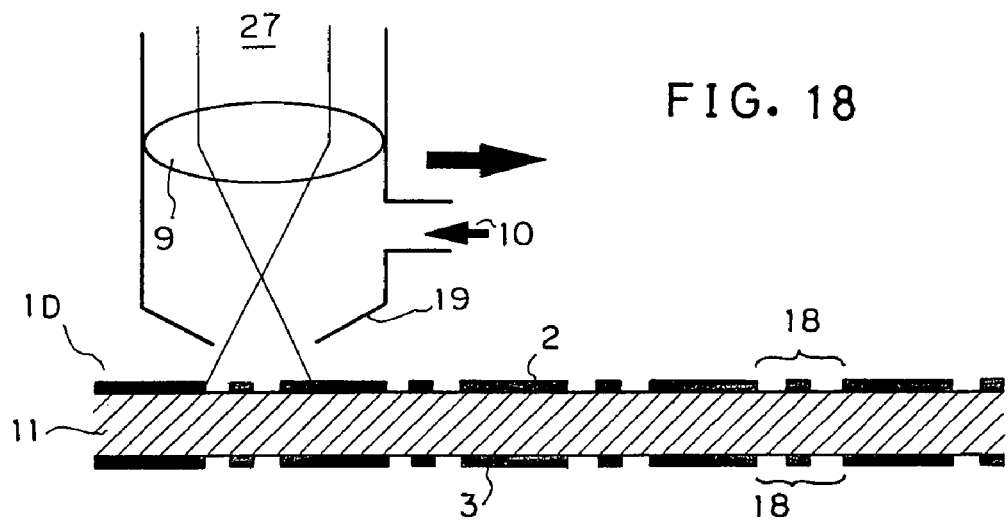
FIG. 18 is a typical diagram illustrating a laser beam machining method for a wiring board according to the embodiment 7 of the present invention.
Figure 19:
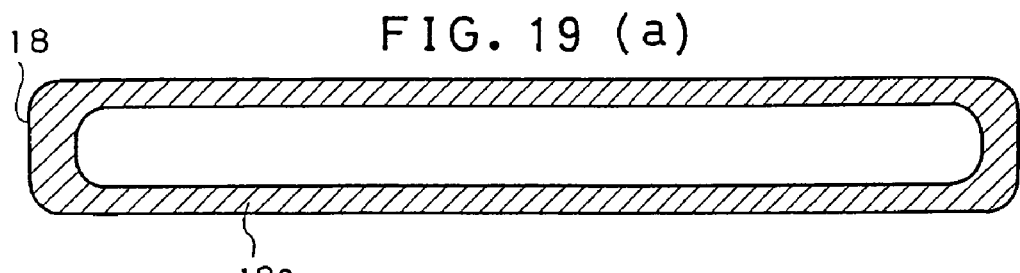
FIG. 19($a$) is a plan view showing a machined shape of a copper foil removed portion in the laser beam machining method for the wiring board according to the embodiment 7 of the present invention.
Figure 19:
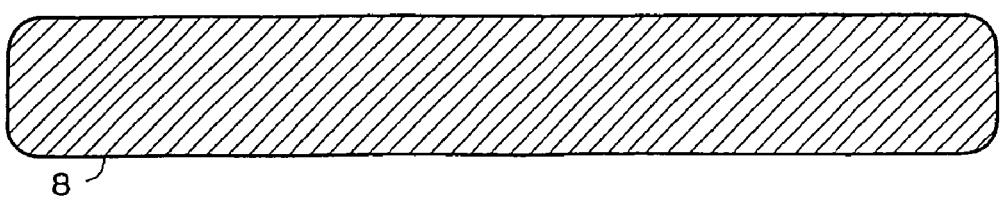

FIG. 18 is a typical diagram illustrating a laser beam machining method for a wiring board according to the embodiment 7 of the present invention. In the drawing, the same reference numerals are used for component parts identical with those in FIG. 1, and descriptions thereof are omitted. Reference numeral 18 means copper foil removed portions. In the embodiment 7, as in the embodiment 6, as a printed board 1D was used a glass epoxy printed board (FR-4) with a thickness of 200 μm and both sides coated with copper. Further, copper foil had a thickness of 18 μm in conductor layers 2 and 3. Etching with a pitch of 2 mm was made to form copper foil removed portions 8 with a width of 1 mm and a length of 10 mm in the top conductor layer 2 and the bottom conductor layer 3 on the printed board 1D at the same position. As shown in FIG. 19(a), the copper foil removed portion 18 was formed by removing copper foil with a width of 100 μm corresponding to only an outer periphery 18a of the copper foil removed portion 18 through the etching. Further, for the purpose of confirmation of an effect in case the copper foil removed portion 18 was used, another etching was made to entirely remove a portion corresponding to a machined portion as in the embodiment 6 so as to form a copper foil removed portion 8 as shown in FIG. 19(b).

A description will now be given of the operation.

A laser beam 27 was emitted from a carbonic acid gas laser with constant pulse energy of 280 mJ, a constant pulse width of 50 μs and a constant pulse frequency of 400 Hz. Further, the laser beam 27 was condensed on the printed board 1D through a ZnSe lens 9 such that the laser beam 27 had a beam diameter of 1 mm on a surface of a machined portion, thereby setting energy density to 35 J/cm$^2$. As in the embodiment 6, a raster scanning was made with a scanning speed of 8 m/min and a scanning pitch of 100 μm such that an entire existence region of the copper foil removed portion 18 was irradiated with the laser beam 27. At the time, air was used as an assist gas 10 for lens protection, and was supplied to the machined portion through a gas nozzle 19 at a flow rate of 10 l/min.

As a result, in the printed board in which only the outer periphery 18a of the copper foil removed portion 18 was machined, it was possible to form a good slit without projection of glass cloth, generation of a char layer, and rigid additional deposits on a periphery of a machined hole. On the other hand, in the printed board with the copper foil removed portion 8 formed by entirely removing the portion corresponding to the machined portion as shown in FIG. 19(b), as described above, no glass cloth projected and no char layer was generated. However, there were rigid residual additionally deposited around the machined hole due to large volumes of removed base materials.

After ultrasonic cleaning and desmearing of the printed board 1D obtained by machining only the outer periphery 18a of the copper foil removed portion 18, the printed board was plated with copper, and a pattern was formed thereon, thereafter observing a section. It was possible to provide a good slit which was completely conductive through the plating without the residual additional deposit around the machined hole and peeling of the copper foil.

As set forth above, according to the embodiment 7, since only the outer periphery 18a of the copper foil removed portion 18 is machined, a volume of removal can be reduced at a time of machining so that the machined hole having the same shape can be provided after the machining. At the time, since a small volume of machined materials can reduce a temperature rise around the machined hole, it is possible to reduce gradation of a temperature gradient as shown in FIG. 7. That is, a larger temperature gradient can be provided to enable good machining causing no failure such as peeling of the copper foil even in case of machining with the removed portion larger than a non-removed portion. Further, a shorter beam irradiation pausing time can be provided than that in a method of irradiating the entire machined portion with the beam, resulting in higher speed machining.

Embodiment 8

Figure 20:
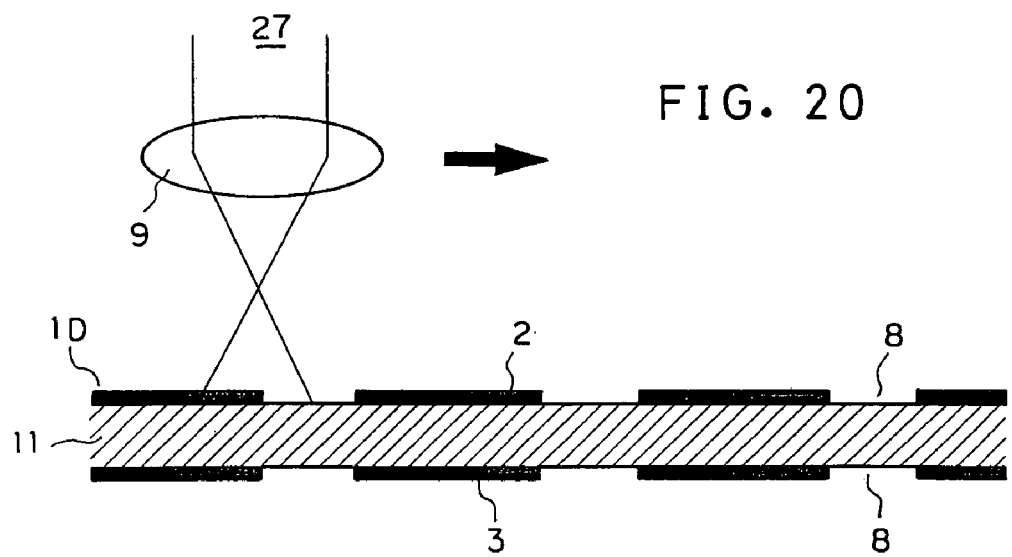
FIG. 20 is a typical diagram illustrating a laser beam machining method for a wiring board according to the embodiment 8 of the present invention.

FIG. 20 is a typical diagram illustrating a laser beam machining method for a wiring board according to the embodiment 8 of the present invention. In the drawing, the same reference numerals are used for component parts identical with those in FIG. 1, and descriptions thereof are omitted. In the embodiment 8, as in the embodiment 6, as a printed board 1D serving as a machining target was used a glass epoxy printed board (FR-4) with a thickness of 200 $\mu$m and both sides coated with copper. Further, copper foil had a thickness of 18 $\mu$m in conductor layers 2 and 3. Etching with a pitch of 10 mm was made to form copper foil removed portions 8 with a width of 1 mm and a length of 10 mm in the top conductor layer 2 and the bottom conductor layer 3 on the printed board 1D at the same position.

A description will now be given of the operation.

Figure 21:
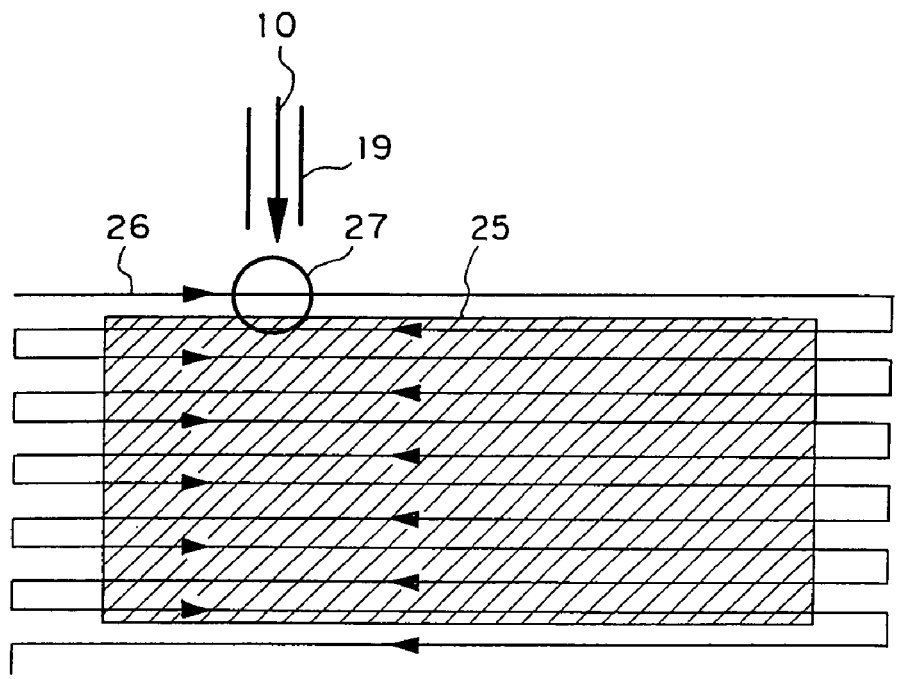
FIG. 21 is an explanatory view showing a direction of raster scanning by a laser beam, and a gas flow spraying direction in the laser beam machining method for the wiring board according to the embodiment 8 of the present invention.

A laser beam 27 was emitted from a carbonic acid gas laser with constant pulse energy of 280 mJ, a constant pulse width of 50 $\mu$s and a constant pulse frequency of 400 Hz. Further, the laser beam 27 was condensed on the printed board 1D through a ZnSe lens 9 such that the laser beam 27 had a beam diameter of 1 mm on a surface of a machined portion, thereby setting energy density to 35 J/cm². As shown in FIG. 21, a raster scanning was made along a path 26 with a scanning speed of 8 m/min and a scanning pitch of 100 $\mu$m such that an entire existence region 25 of the copper foil removed portion 8 was irradiated with the laser beam 27. At the time, air was used as an assist gas 10, and was sprayed and supplied to the machined portion at a flow rate of 50 l/min in a direction from a machining start portion to a machining end portion through a gas nozzle 19 moving integrally with the laser beam 27.

As a result, additional deposits around a machined hole were blown away by the assist gas, and adhered to only a portion to be subsequently machined. The additional deposits were removed by the laser beam 27 at a time of the machining, and a small amount of additional deposits were finally left at the machining end portion. The additional deposits were removed by a method identical with the laser beam machining method for the wiring board described in the embodiment 6.

After ultrasonic cleaning and desmearing of the printed board 1D obtained by the above steps, the printed board was plated with copper, and a pattern was formed thereon, thereafter observing a section. It was possible to provide a good slit which was completely conductive through the plating without the residual additional deposit around the machined hole.

As set forth above, according to the embodiment 8, a gas flow is sprayed onto the currently machined printed board 1D in the direction from the beam irradiation start portion to the beam irradiation end portion in the machined portion, thereby blowing away the removed material to an area to be subsequently irradiated with the laser beam 27, and depositing the material on a surface thereof. Since the deposit can be removed concurrently with removal of the base material, it is possible to reduce the removed material deposited on a surface of the printed board 1D after the machining, and reduce the printed board cleaning step after the machining. Further, it is possible to significantly reduce an area having the residual additional deposit even in machining with large volumes of removed materials.

Embodiment 9

Figure 22:
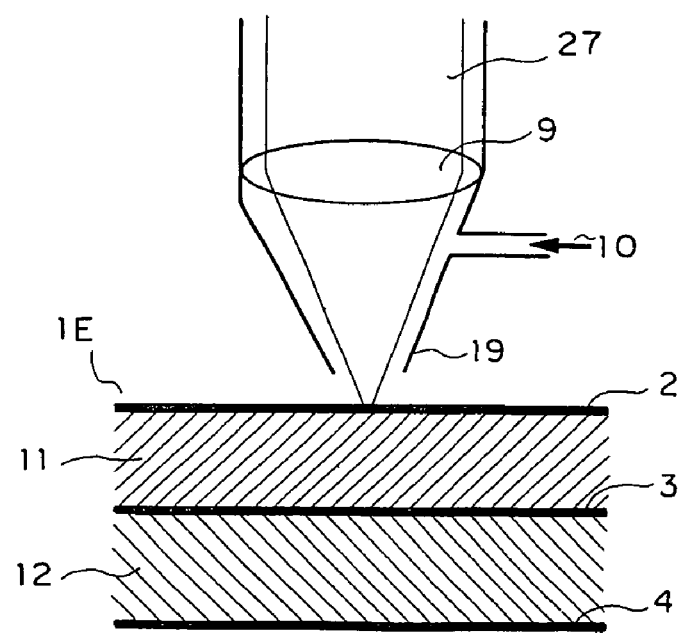
FIG. 22 is a typical diagram illustrating a laser beam machining method for a wiring board according to the embodiment 9 of the present invention.

FIG. 22 is a typical diagram illustrating a laser beam machining method for a wiring board according to the embodiment 9 of the present invention. In the drawing, the same reference numerals are used for component parts identical with those in FIG. 1, and descriptions thereof are omitted. In the embodiment 9, as a printed board 1E was used a three-layer glass epoxy printed board (FR-4) with a thickness of 200 $\mu$m and both sides coated with copper foil. Further, copper foil had a thickness of 18 $\mu$m in conductor layers 2, 3, and 4. The top conductor layer 2 was provided with no copper foil removed portion formed by etching.

A description will now be given of the operation.

A laser beam 27 was emitted from a carbonic acid gas laser with pulse energy of 400 mJ and a pulse width of 100 $\mu$s. Further, the laser beam 27 was condensed on the printed board 1E through a ZnSe lens 9 at a just focus position at which the laser beam 27 had the minimum spot diameter, thereby irradiating with one pulse. Thereafter, at intervals of a beam irradiation pausing time of 50 ms, the printed board was irradiated with ten pulses of the laser beam 27 with pulse energy of 150 mJ and a pulse width of 100 $\mu$s. At the time, air was used as an assist gas 10 for lens protection, and was supplied to a machined portion at a flow rate of 10 l/min through a gas nozzle 19. In the first irradiated laser beam 27, pulse energy has sufficient intensity to melt and remove the top conductor layer 2. In the second and later laser beams 27, pulse energy has insufficient intensity to melt the top conductor layer 2.

Figure 23:
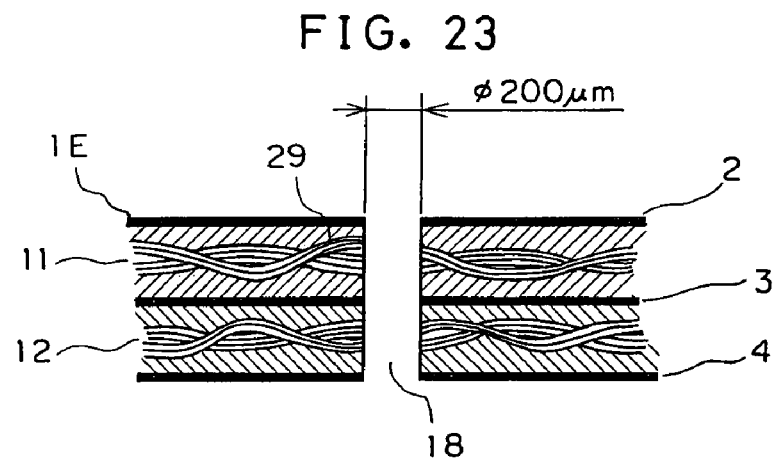
FIG. 23 is a typical diagram showing the result of machining of a printed board according to the embodiment 9 of the present invention.

FIG. 23 is a typical diagram showing one illustrative result of machining for the printed board according to the embodiment 9. In the top conductor layer 2, copper foil including a substantially complete round with a diameter of 200 $\mu$m was removed with little effect of heat on a periphery. Further, under the conductor layer 2, the machining can be made to form a substantially straight hole reaching the lowermost copper foil with a small amount of projection of glass cloth 29. After ultrasonic cleaning and desmearing of the obtained machined hole, the machined hole was plated with copper, and a pattern was formed, thereafter observing a section. It was possible to provide a good through-hole with the diameter of 200 $\mu$m and a smooth inner wall.

As set forth above, even when the copper foil is not previously removed in another step such as etching, the machined portion may be irradiated with the pulsed laser beam 27 from the carbonic acid gas laser at the just focus position, thereby increasing the energy density. It is thereby possible to finely remove the top copper foil with little effect of heat on the periphery. Thereafter, the printed board may be irradiated a plurality of times with the laser beam 27 having smaller pulse energy at intervals of a long beam irradiation pausing time, resulting in the through-hole with no char layer. It is thereby possible to omit the etching serving as a previous step which is essential in the prior art, and simplify manufacturing steps. Further, both of the above beam irradiation conditions are identical with those described in, for example, the embodiments 1 and 2. That is, the printed board was irradiated with the pulsed laser beam 27 for a beam irradiation time ranging from 10 to 200 $\mu$s, most suitable for machining of the glass epoxy board, and at intervals of the beam irradiation pausing time of 15 ms or more. Therefore, it is possible to provide a sharp temperature gradient of the machined portion, and provide a platable hole with a substantially negligible amount of projection of the glass cloth. As set forth above, even in the printed board having surfaces coated with the copper foil and containing the glass cloth, it is possible to rapidly and accurately provide a hole by only the laser beam machining step without previously removing the conductor layer such as the copper foil on the surface of the printed board through the etching, and so forth.

Embodiment 10

Figure 24:
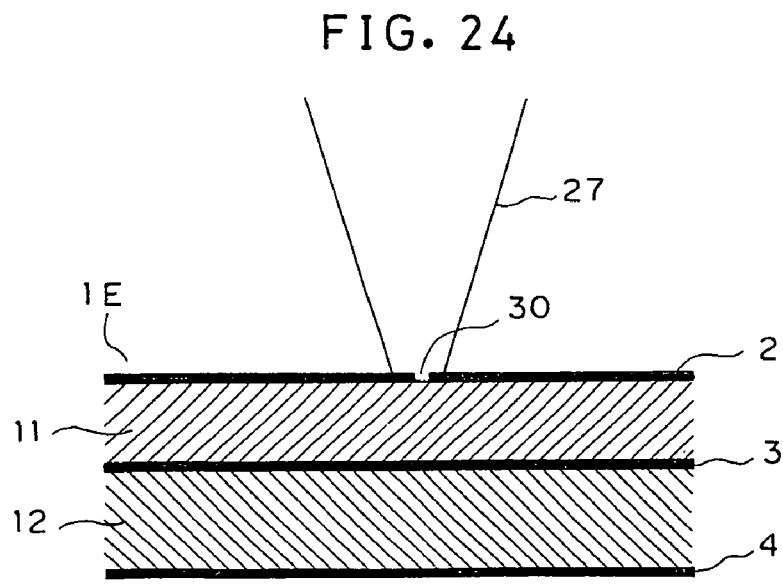
FIG. 24 is a typical diagram showing a laser beam machining method for a wiring board according to the embodiment 10 of the present invention.

FIG. 24 is a typical diagram showing a laser beam machining method for a wiring board according to the embodiment 10 of the present invention. In the drawing, the same reference numerals are used for component parts identical with those in FIG. 1, and descriptions thereof are omitted. In the embodiment, as in the embodiment 9, as a printed board 1E was used a three-layer glass epoxy printed board (FR-4) with a thickness of 200 $\mu$m and both sides coated with copper foil. Further, copper foil had a thickness of 18 $\mu$m in conductor layers 2, 3, and 4. The top conductor layer 2 was provided with a finely removed portion 30 in a range smaller than an area to be machined.

A description will now be given of the operation.

A laser beam 27 was emitted from a carbonic acid gas laser with pulse energy of 200 mJ and a pulse width of 100 $\mu$s.

Further, the laser beam 27 was condensed on the printed board 1E through a ZnSe lens 9 at a just focus position at which the laser beam 27 had the minimum spot diameter, thereby irradiating with one pulse. Thereafter, at intervals of a beam irradiation pausing time of 50 ms, the printed board was irradiated with ten pulses of the laser beam 27 with pulse energy of 150 mJ and a pulse width of 100 $\mu$s. As a result, as in the embodiment 9, in the top conductor layer 2, copper foil including a substantially complete round with a diameter of 200 $\mu$m was removed with little effect of heat on a periphery. Further, under the conductor layer 2, the machining can be made to form a substantially straight hole reaching copper foil of the lowermost conductor layer 4 with a small amount of projection of glass cloth.

Figure 25:
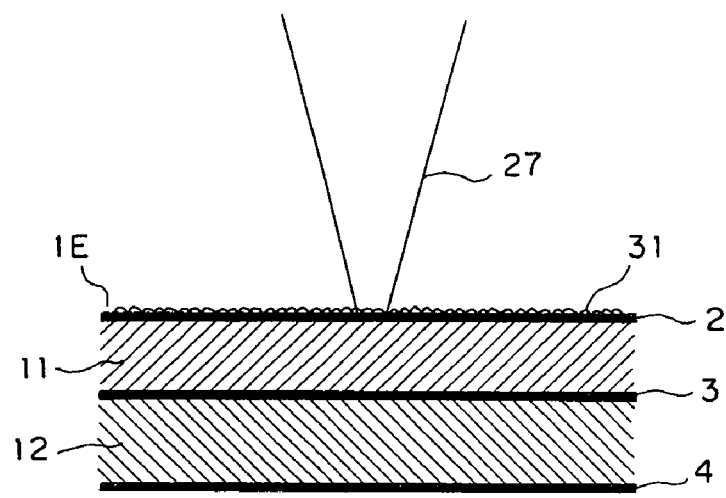
FIG. 25 is a typical diagram showing a laser beam machining method for a wiring board according to one modification of the embodiment 10 of the present invention.

Instead of the finely removed portion 30 shown in FIG. 24, as shown in FIG. 25, surface roughening shown by reference numeral 31 may be made to a surface of the conductor layer 2. The surface roughening utilizes, for example, chemical treatment typically used to enhance adhesive properties between a resin layer and a conductor layer. The surface roughening to the surface of the conductor layer 2 can improve absorption of the laser beam 27 when the copper foil having a desired shape is removed from the conductor layer 2, and enables efficient and more stable drilling.

As set forth above, the slight copper foil of a beam irradiated portion is previously removed by the etching, and the surface roughening is made to the surface. The treated portions trigger the absorption of the laser beam 27 from the carbonic acid gas laser so that the top copper foil can be removed even when the first irradiated beam has low energy density as in the embodiment 9.

Alternatively, the two methods according to the embodiment 10 may concurrently be used including one method in which the slight copper foil of the beam irradiated portion is previously removed by the etching, and the other method in which the surface roughening is made to the surface. Alternatively, either one or both of the methods may be used concurrently with the method in the embodiment 9. In either case, as in the embodiment 9, the top copper foil can be removed even when the first irradiated beam has low energy density.

Embodiment 11

Figure 26:
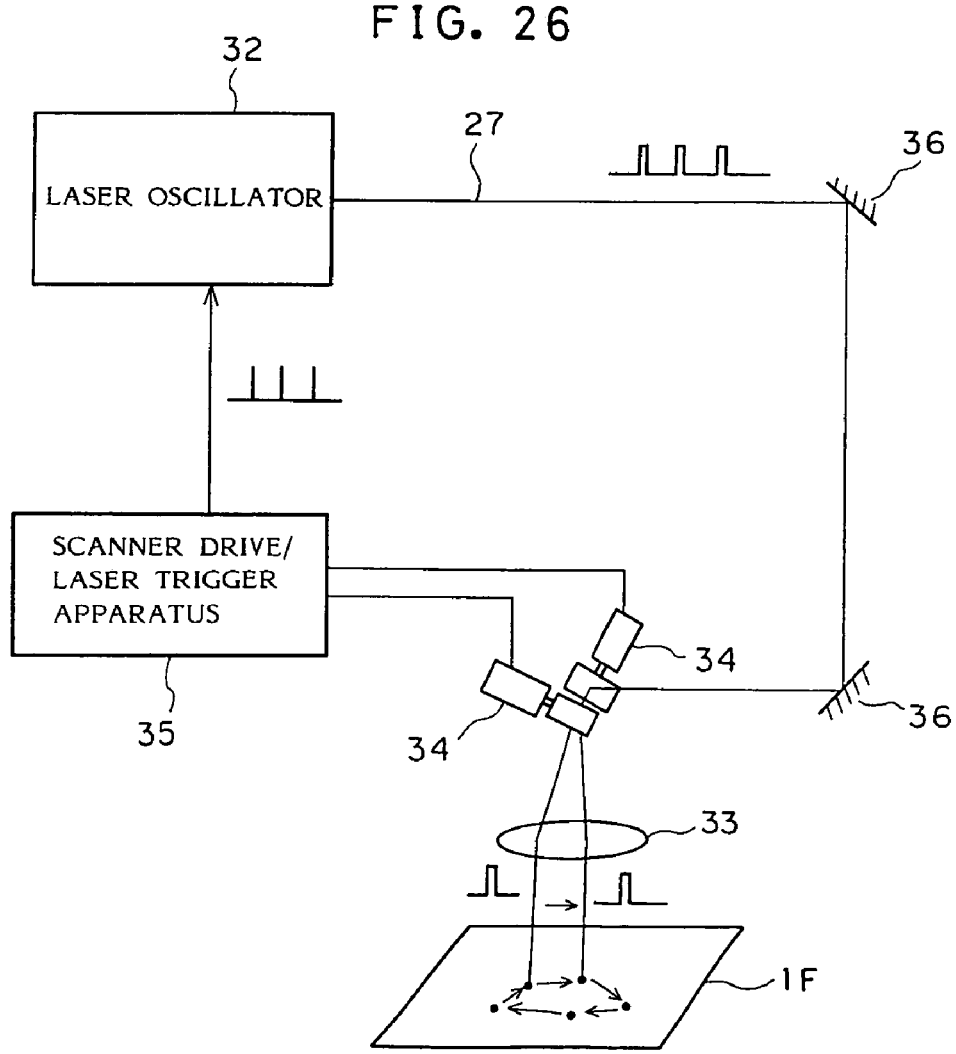
FIG. 26 is a typical diagram showing a laser beam machining method for a wiring board, and a laser beam machining apparatus for a wiring board according to the embodiment 11 of the present invention.

FIG. 26 is a typical diagram showing a laser beam machining method for a wiring board, and a laser beam machining apparatus for a wiring board according to the embodiment 11 of the present invention. In the drawing, reference numeral 32 denotes a laser oscillator, 33 is an f$\theta$ lens to condense a laser beam 27, 34 is beam scanner apparatus (optical mechanisms) using a galvanometer scanner, and 35 is a scanner drive/laser trigger apparatus (control mechanism) to output a drive command for the beam scanner apparatus 34 and a trigger of laser oscillation for the laser oscillator 32.

A description will now be given of the operation.

The scanner drive/laser trigger apparatus 35 outputs the trigger of the laser oscillation for the laser oscillator 32 at a predetermined pulse frequency, and the drive commands for the two beam scanner apparatus 34. It is thereby possible to position a spot of the laser beam 27 at high speed at an optional drilling position on the printed board 1F having many drilling positions in synchronization with a pulse frequency of the laser beam 27 radiated from the laser oscillator 32.

A machining speed per unit time becomes higher as the pulse frequency becomes higher. However, when irradiation with a plurality of pulses is required for drilling at one position, successive irradiation with a high pulse frequency makes a char layer thicker so that a good hole can not be provided. For example, as seen from a relationship shown in FIG. 6, the char layer is made thicker by beam irradiation at intervals of a beam irradiation pausing time less than 15 ms, that is, at a frequency more than 67 Hz.

Thus, the spot of the laser beam 27 is sequentially moved to different drilling positions for each pulse. After all of the many drilling positions in the range of a scan vision are irradiated with the laser beam 27 pulse by pulse (after the elapse of a substantial time of 15 ms or more), or after the elapse of a time of 15 ms or more from irradiation of the first drilling position with the laser beam 27, the spot is returned to the first drilling position. The spot is sequentially moved once again, and the movement is repeated several times. It is thereby possible to irradiate one drilling position with the laser beam a plurality of times while ensuring a beam irradiation pausing time of 15 ms or more for each drilling position. Therefore, if in synchronization at a frequency of 200 Hz by using, for example, the beam scanner apparatus 34 having the galvanometer scanner shown in FIG. 26, a time of 5 ms is required for each hole. Consequently, when the scan vision includes three or more drilling positions, and the spot is sequentially moved toward the positions, the beam irradiation pausing time of 15 ms or more can be ensured for each drilling position.

As set forth above, according to the embodiment 11, even if the laser beam 27 having a high pulse frequency is used, the beam irradiation can be made while ensuring the beam irradiation pausing time of 15 ms or more for each machined portion. It is thereby possible to provide a high quality platable hole having little char layer and no projection of glass cloth. Further, a scanning frequency of the spot of the laser beam 27 can be increased to its limitation so as to enable high-speed drilling, and drill for many holes in a short time. Therefore, it is possible to considerably improve productivity of the printed board containing the glass cloth.

Embodiment 12

Figure 27:
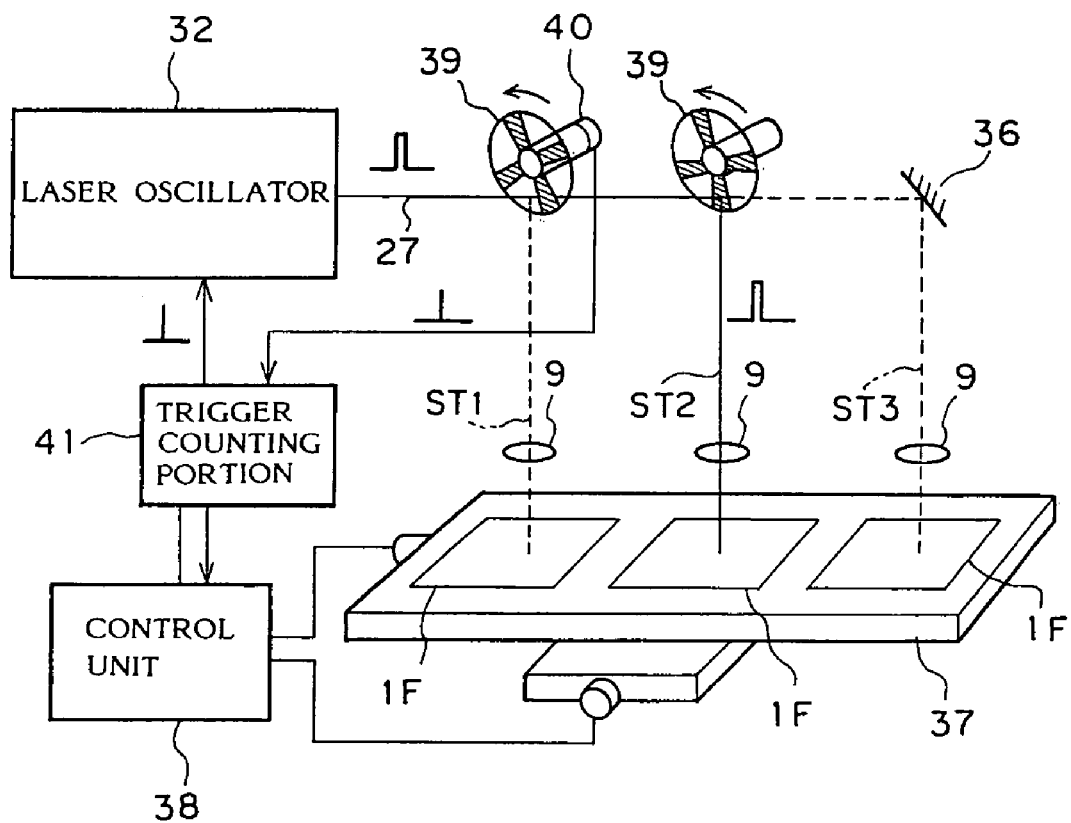
FIG. 27 is a typical diagram showing a laser beam machining method for a wiring board, and a laser beam machining apparatus for a wiring board according to the embodiment 12 of the present invention.

FIG. 27 is a typical diagram showing a laser beam machining method for a wiring board, and a laser beam machining apparatus for a wiring board according to the embodiment 12 of the present invention. In the drawing, reference numeral 36 means a reflection mirror disposed across an optical axis of a laser beam 27, and 37 is an XY table on which three printed boards 1F are mounted, for moving the printed boards in a horizontal plane. That is, the XY table 37 includes three machining stations. In addition, reference numeral 38 means a control unit for the XY table 37, 39 is rotary choppers, 40 is a trigger generating apparatus, 41 is a trigger counting portion, and ST1 to ST3 are one pulses of the laser beam 27. The laser beam machining method for the wiring board according to the embodiment 12 is used for concurrent machining of the plurality of printed boards 1F. The embodiment will be described by way of a method for the concurrent machining of the three printed boards 1F as one example. In the embodiment, an optical mechanism includes the rotary choppers 39 and the reflection mirror 38, and a synchronization control mechanism includes the trigger generating apparatus 40 and the trigger counting portion 41.

A description will now be given of the operation.

Figure 28:
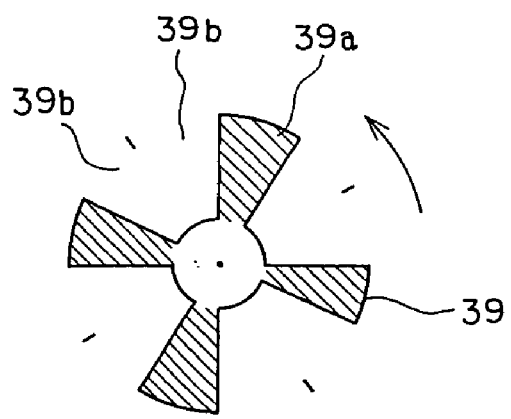
FIG. 28 is a typical diagram of a rotary chopper according to the embodiment 12 of the present invention.

As shown in FIG. 28, in the rotary chopper 39, a disk mounted perpendicular to a rotation axis is equally divided into (3×n) areas (n=1, 2, 3, . . . ), and the equally divided areas are repeatedly mounted in the order of a reflection surface 39a, a passing portion 39b, and a passing portion 39b in a direction of rotation. In FIG. 28, the rotary chopper 39 is a cross-shaped reflector obtained by equally dividing a disk into (3×4) areas to have the four reflection surfaces 39a.

As shown in FIG. 27, the two rotary choppers 39 are mounted between the laser oscillator 32 and the reflection mirror 36, and are set to rotate, with a deviation by one of the equally divided areas, in synchronization with each other at the same speed. Any one of the rotary choppers 39 is provided with the trigger generating apparatus 40 to output the trigger to the trigger counting portion 41 each time the (3×n) equally divided areas respectively move across the optical axis of the laser beam 27. The trigger generating apparatus 40 sends the generating trigger to the trigger counting portion 41. The trigger counting portion 41 counts the received trigger, and sends the trigger to the laser oscillator 32 if a count value is valid (a predetermined count value is not reached). When the laser oscillator 32 receives the trigger from the trigger generating apparatus 40 through the trigger counting portion 41, the laser oscillator 32 immediately outputs the laser beam 27 by only one pulse with a pulse width of 200 μs or less. The laser beams 27 including optional successive three pulses are outputted in such a manner, and are sequentially reflected at any one of the two rotary choppers 39 and the reflection mirror 36 so as to be introduced to the three machining stations. Through a ZnSe lens 9, the three printed boards 1F are respectively irradiated with the laser beams 27. When the predetermined number of triggers is counted, the trigger counting portion 41 disables the next and later triggers to the laser oscillator 32, and sends a table moving trigger to the control unit 38 of the XY table 37. When the XY table 37 is completely positioned, the trigger counting portion 41 enables a trigger again by receiving a positioning completion signal from the control unit 38 of the XY table 37.

Figure 29:
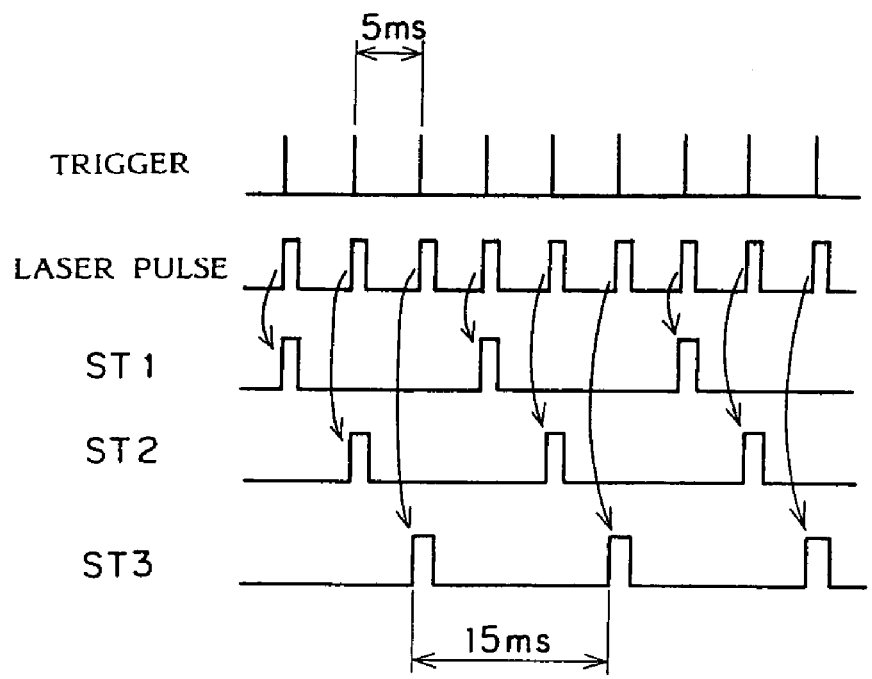
FIG. 29 is a time chart of a trigger and laser pulses in the embodiment 12 of the present invention.

FIG. 29 is a time chart of the trigger and laser pulses in the embodiment 12. As shown in FIG. 29, the machining stations are respectively irradiated with the laser beam 27 shown by any one of reference numerals ST1, ST2, and ST3 once every generation of any one of three triggers from the trigger generating apparatus 40. For example, when the two rotary choppers 39 are rotated such that the trigger from the trigger generating apparatus 40 can have a cycle of 5 ms or more, the machining stations are respectively irradiated with pulses at time intervals of 15 ms or more. As seen from a relationship shown in FIG. 6, it is thereby possible to drill for a good hole with a small amount of a char layer. When the beam irradiation is required m times for each drilling and sequential drilling is made for other holes, the predetermined number of triggers in the trigger counting portion 41 may be set to (3×m). It is thereby possible to machine the entire areas of the three printed boards 1F by repeating the beam irradiation and movement of the table.

As set forth above, according to the embodiment 12, there is no decrease in energy of the laser beam 27 in the respective machining stations. Further, the speed of rotation of the rotary choppers 39 is set such that the laser beams 27 can be transferred to the machining stations at time intervals of 15 ms or more. It is thereby possible to concurrently provide in the plurality of printed boards 1F high quality platable holes without projection of glass cloth, and more rapidly machine the printed board 1F containing the glass cloth, resulting in a significant improvement of productivity. Further, the combination of the beam scanner apparatus 34 in the embodiment 11 and the embodiment 12 can reduce a time required for the movement of the table, and enables higher speed machining of the plurality of printed boards.

Embodiment 13

Figure 30:
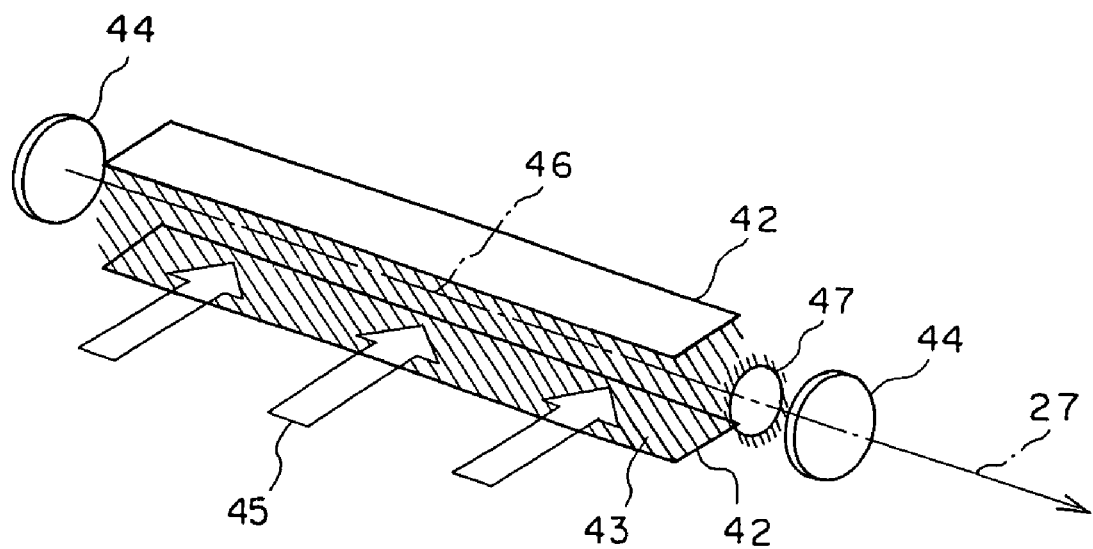
FIG. 30 is a perspective view of a carbonic acid gas laser oscillator for machining a wiring board according to the embodiment 13 of the present invention.

FIG. 30 is a perspective view showing a structure of a carbonic acid gas laser oscillator for machining a wiring board according to the embodiment 13 of the present invention. In the drawing, reference numeral 42 means a pair of discharge electrodes to form a discharge space 43 in a gap therebetween, 44 is a resonator mirror, 45 is a gas flow serving as laser medium, 46 is an optical axis of a laser beam 27, and 47 is an aperture to select the degree of mode of the laser beam 27. The unit including the optical axis 46 of the laser beam 27, the gas flow 45, and a direction of discharge in an orthogonal relationship is typically referred to as three-axes orthogonal type laser oscillator.

A description will now be given of the operation.

Figure 31A:
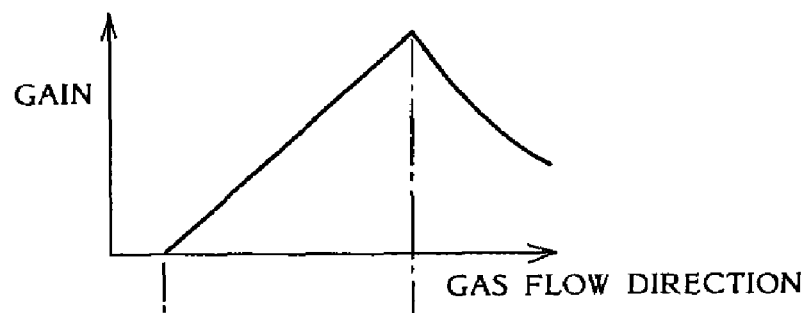
FIGS. 31(a) and 31(b) are typical diagrams respectively showing a gain distribution and arrangement of an optical axis in a discharge space in a conventional carbonic acid gas laser oscillator.
Figure 31B:
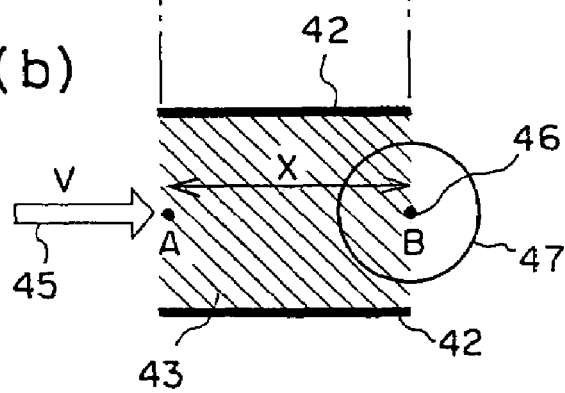

Discharge power is fed from the discharge electrodes 42 to form the discharge space 43 into which the gas flow 45 flows. A molecule in the gas flow 45 is excited by energy of discharge to have a gain to light. When the discharge space 43 is formed in a stationary manner, there is formed a stationary gain distribution having a peak in the vicinity of the downstream of the discharge space 43 as shown in FIG. 31(a). Therefore, in order to efficiently provide stationary laser oscillation, that is, successive output (CW output), it is necessary to dispose the optical axis 46 and the aperture 47 across a line which vertically travels in the downstream of the discharge space 43 providing the maximum gain distribution as shown in FIG. 31(b). For the purpose, in the prior art, a typical three-axes orthogonal type of carbonic acid gas laser oscillator has the above structure.

Figure 32:
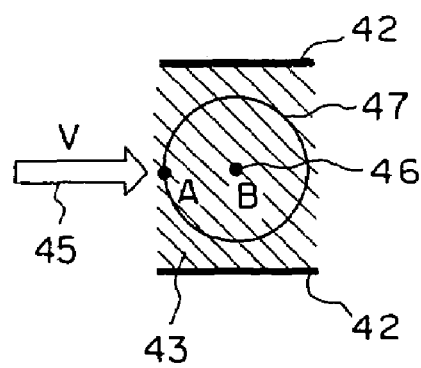
FIG. 32 is a typical diagram showing arrangement of an optical axis in the carbonic acid gas laser oscillator for machining the wiring board according to the embodiment 13 of the present invention.
Figure 33:
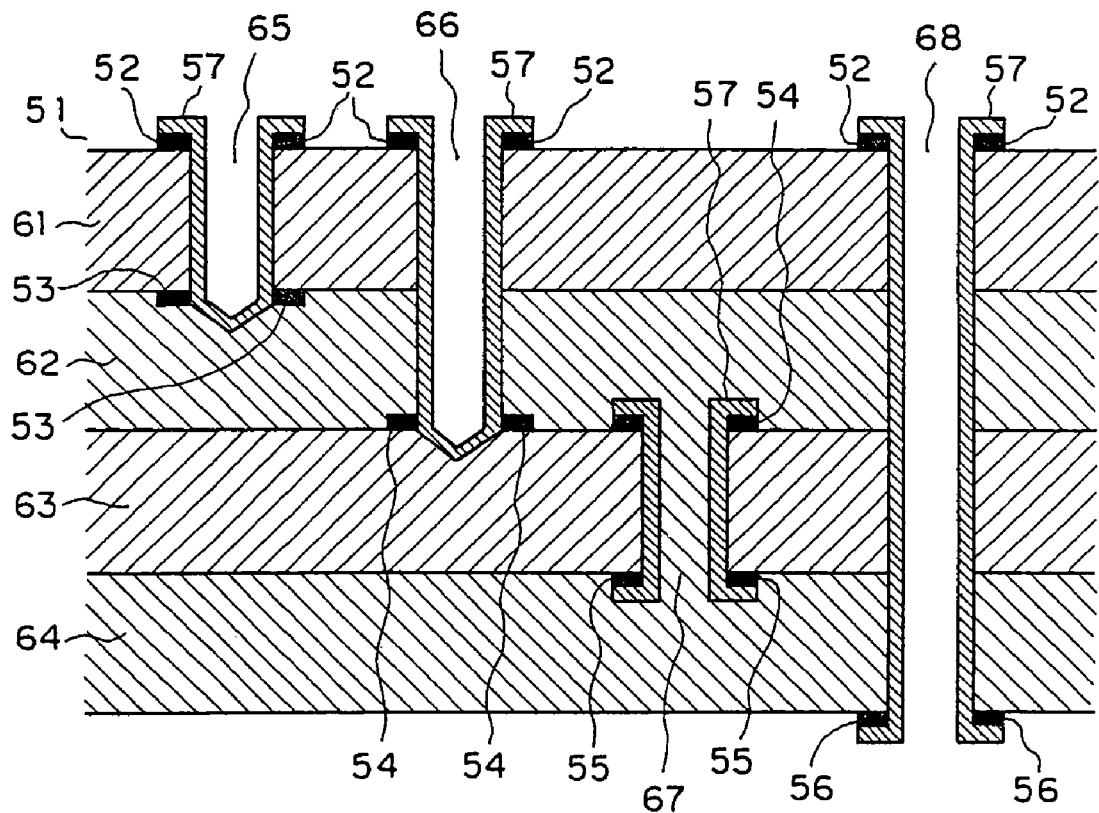
FIG. 33 is a sectional view showing a structure of a conventional multi-layer printed board.
Figure 34:
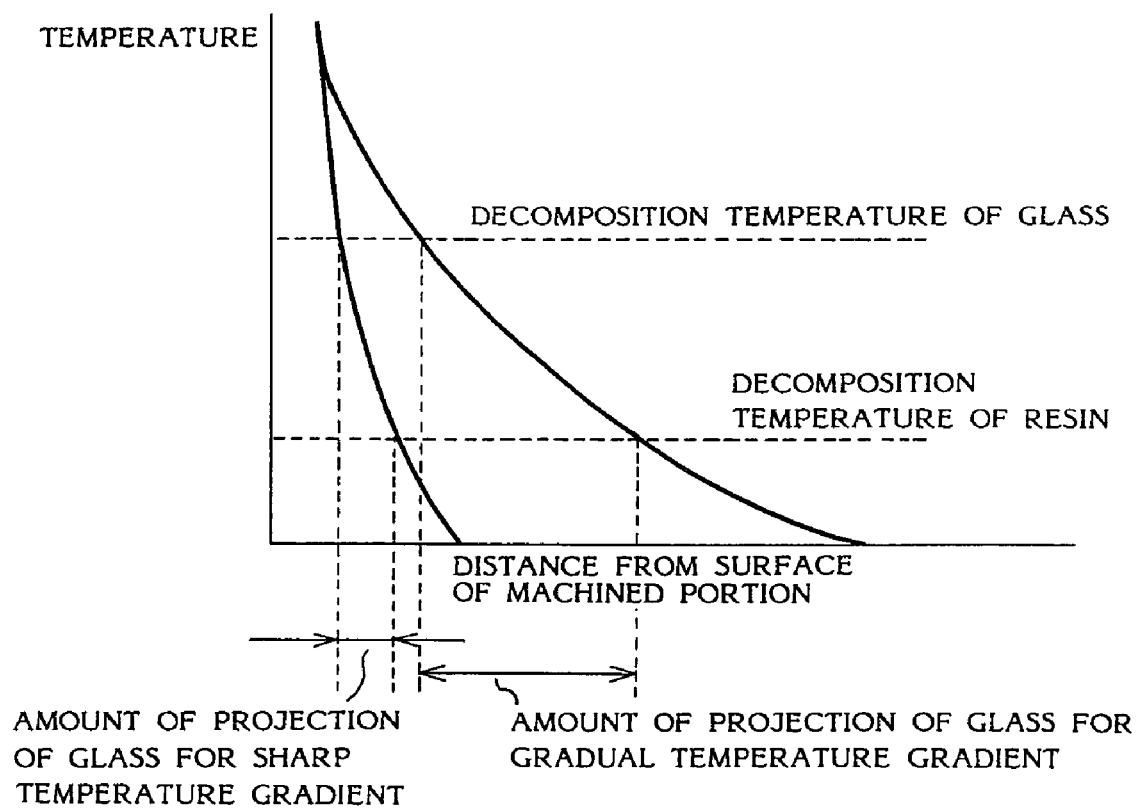
FIG. 34 is a graph diagram showing a mechanism to generate a reduction in quality in a conventional laser beam machining method for a wiring board.

However, unlike the prior art, there is provided the carbonic acid gas laser oscillator for machining the printed board according to the embodiment 13 of the present invention having a structure as shown in FIG. 32. In the structure, the aperture 47 is disposed in the range in that the aperture 47 does not extend off the discharge space 43, and the optical axis 46 is disposed on a line vertically travelling on the farthest upstream side of the discharge space 43.

In a conventional structure shown in FIG. 31(b), it can be considered that energy of an excited molecule at a point A in the upstream of the discharge space 43 is converted into the laser beam 27 at a time of reaching a point B. Further, it can be seen that an excited molecule at the point A at the moment at which the discharge is stopped is converted into the laser beam 27 after the elapse of a time of (X/V) (where V is a gas flow rate, and X is a distance from the point A to the point B). Therefore, when the optical axis 46 is disposed in the downstream of the discharge space 43 as shown in FIG. 31(b), a time required for disappearance of the laser beam 27 after the discharge is stopped becomes longer, and a fall of a laser pulse at a time of pulse oscillation becomes slower than would be in case where the optical axis 46 is disposed in the upstream of the discharge space 43 as in the embodiment 13 shown in FIG. 30. For example, in the conventional laser oscillator with a 30 mm distance between the point A and the point B, that is, a 30 mm width of the discharge electrode 42 and a gas flow rate of 80 m/s, a fall time of the laser pulse becomes 375 $\mu$s. Even if a fall time of the discharge power itself is reduced, it is impossible to reduce the fall time of the laser pulse.

On the other hand, according to the embodiment 13 shown in FIG. 32, the aperture 47 is disposed in the range that the aperture 47 does not extend off the discharge space 43, and the optical axis 46 is disposed on the line vertically travelling on the farthest upstream of the discharge space 43. For example, for a 6.5 mm distance between the point A and the point B and the gas flow of 80 m/s, it is possible to provide an 81 $\mu$s fall time of the laser pulse. In this case, it is necessary to provide a sufficiently short fall time of the discharge power because a fall time of the laser pulse is affected by a longer fall time of the discharge power than the fall time of the pulse. When the optical axis 46 is disposed as in the embodiment shown in FIG. 32, the fall time of the discharge power is preferably set to 50 $\mu$s or less. When the optical axis 46 is disposed as in the embodiment 13 shown in FIG. 32, a rise time of the discharge power has an effect on a rise time of the laser pulse. Thus, the rise time of the discharge power is preferably set to 50 $\mu$s or less in order to obtain a narrow pulse width of 200 $\mu$s or less.

As set forth above, according to the embodiment 13, it is possible to provide the laser pulse having a sharp rise, a sharp fall, and the pulse width of 200 $\mu$s or less, which can not be provided by the conventional carbonic acid gas laser. The machining can be made without projection of glass cloth and generation of a char layer by applying the laser pulse to the machining of the printed board.

As set forth above, according to the present invention, there is provided the laser beam machining method for the wiring board, including the step of irradiating the machined portion of the wiring board with the pulsed laser beam for the beam irradiation time ranging from 10 to 200 $\mu$s and with the energy density of 20 J/cm$^2$ or more. As a result, there is an effect in that good and fine machining can be made in, for example, the drilling for the through-hole and the blind via hole, the grooving, and the cutting for the outside shape with respect to the board made of the composite material having inclusion such as glass cloth.

According to the present invention, there is provided the laser beam machining method for the wiring board, including the step of irradiating the same machined portion of the wiring board with the pulsed laser beam with intervals of the beam irradiation pausing time of 15 ms or more and the energy density of 20 J/cm$^2$ or more. As a result, there are effects in that the conduction hole can be obtained with the high aspect ratio which can not be obtained by the single pulse, projection of the glass cloth can be reduced, and the wiring board containing the glass cloth can rapidly and accurately be machined even in case of the multi-pulse irradiation.

According to the present invention, there is provided the laser beam machining method for the wiring board, including the step of irradiating the same machined portion of the wiring board with the pulsed laser beam with the plurality of pulse groups respectively including the plurality of pulses respectively having the energy density of 20 J/cm$^2$ or more at intervals of the pulse group interval irradiation pausing time longer than the predetermined beam irradiation pausing time. As a result, there are several effects of machining for the conduction hole in a shorter time than would be in the machining employing the single pulse frequency, prevention of the temperature rise at the machined portion, a reduction in gradation of the temperature gradient with respect to the depth distance from the surface of the machined portion, and a reduction in projection of the glass cloth.

According to the present invention, there is provided the laser beam machining method for the wiring board, in which the predetermined beam irradiation pausing time is 4 ms or more, the number of pulses in the pulse group is 4 or less, and the pulse group interval beam irradiation pausing time exceeds 20 ms. As a result, there are effects of reduced generation of the char layer in the machined hole, and good and fine machining in the drilling for the through-hole and the blind via hole, the grooving, the cutting for the outside shape, and so forth.

According to the present invention, there is provided the laser beam machining method for the wiring board, including the step of, at a time of scanning the surface of the wiring board while irradiating the machined portion of the wiring board with the pulsed laser beam, scanning by the laser beam such that the machined portion is not continuously irradiated with the laser beam over 4 pulses and at intervals of the beam irradiation pausing time less than 15 ms. As a result, there are effects in that it is possible to reduce generation of the char layer in the machined hole, and increase the machining speed while keeping the same machining quality as that in machining by positioning the beam at the machined portions.

According to the present invention, there is provided the laser beam machining method for the wiring board, including the steps of providing the 1 mm beam diameter on the surface of the machined portion, and scanning the surface of the wiring board at the scanning speed ranging from 8 to 6 m/min while irradiating the machined portion with the laser beam for the beam irradiation time ranging from 10 to 200 $\mu$s and at intervals of the beam irradiation pausing time of 2.5 ms. As a result, there are effects in that it is possible to increase the machining speed while keeping the same machining quality as that in machining by positioning the beam at the machined portions, and provide good and fine machining such as drilling for the blind via hole in the board made of the composite material having inclusion such as glass.

According to the present invention, there is provided the laser beam machining method for the wiring board, including the steps of setting the laser beam to have the square spot effective in the machining of the machined portion of the wiring board, and scanning the surface of the wiring board while irradiating the machined portion of the wiring board with the pulsed laser beam. As a result, there is an effect in that the machining speed can be more increased with good machining quality than would be in case of the circular beam.

According to the present invention, there is provided the laser beam machining method for the wiring board, including the steps of setting the square spot of the laser beam on the machined portion to have the size of 0.9 mm×0.9 mm, and scanning the surface of the wiring board with the scanning speed of 6 m/min and the scanning pitch of 200 μm while irradiating the machined portion with the laser beam for the beam irradiation time ranging from 10 to 200 μs and at intervals of the beam irradiation pausing time of 1.25 ms. As a result, there are effects in that higher quality can be kept than would be in case of the circular beam, and the machining speed can be increased.

According to the present invention, there is provided the laser beam machining method for the wiring board, including the steps of previously removing the metallic layer on the wiring board at the portion corresponding to the machined portion of the wiring board, forming the base material removed portion through the machining by irradiating the base material of the machined portion with the laser beam through the metallic layer removed portion, and additionally irradiating the base material removed portion and the periphery of the base material removed portion, or only the periphery of the base material removed portion with the laser beam. As a result, there is an effect in that the rigid additional deposit generated during the machining can simply be removed without the complicated step such as wet etching even in the machining having large volumes of removed materials.

According to the present invention, there is provided the laser beam machining method for the wiring board, including the steps of previously removing the metallic layer on the wiring board at the portion corresponding to the machined portion of the wiring board, forming the base material removed portion through the machining by irradiating the base material of the machined portion with the laser beam through the metallic layer removed portion, and additionally irradiating and scanning the base material removed portion and the periphery of the base material removed portion, or only the periphery of the base material removed portion with the laser beam having a smaller peak output than that of the above laser beam at a higher scanning speed than a scanning speed during first laser beam irradiation. As a result, there is an effect in that the rigid additional deposit caused during the machining can simply be removed without the complicated step such as wet etching even in the machining having large volumes of removed materials.

According to the present invention, there is provided the laser beam machining method for the wiring board, including the step of, at the time of previously removing the metallic layer on the wiring board at the portion corresponding to the machined portion, partially removing the metallic layer such that the laser beam can reach only the outer periphery of the base material removed portion to be formed by irradiating the base material of the machined portion with the laser beam. As a result, there is an effect of good machining causing no failure such as peeling of the metallic layer even in case of machining with the removed portion larger than the non-removed portion.

According to the present invention, there is provided the laser beam machining method for the wiring board, including the steps of partially removing the metallic layer such that the laser beam can reach only the outer periphery of the base material removed portion to be formed by irradiating the base material of the machined portion with the laser beam, and scanning the surface of the wiring board with the scanning speed of 8 m/min and the scanning pitch of 100 μm while irradiating the machined portion with the laser beam for the beam irradiation time ranging from 10 to 200 μs and at intervals of the beam irradiation pausing time of 2.5 ms. As a result, there is an effect of good machining causing no failure such as peeling of the metallic layer because the base material removed portion is not entirely removed even in case of machining with the base material removed portion larger than the non-removed portion.

According to the present invention, there is provided the laser beam machining method for the wiring board, including the steps of previously removing the metallic layer on the wiring board at the portion corresponding to the machined portion, and flowing the gas in the direction from the laser beam scanning start point to the laser beam scanning end point in the machined portion at the time of the machining by irradiating the base material of the machined portion with the laser beam while scanning by the laser beam through the metallic layer removed portion. As a result, there are effects in that it is possible to effectively eliminate the adverse effect of the residual additional deposit on the machining even in the machining with large volumes of removed materials, and significantly reduce the area having the residual additional deposit.

According to the present invention, there is provided the laser beam machining method for the wiring board, including the steps of forming the metallic layer having the desired shape by partially removing the metallic layer by pulse irradiation with the laser beam having the sufficient intensity to melt and remove the metallic layer on the wiring board, and additionally irradiating the machined portion of the wiring board through the metallic layer removed portion with the laser beam having the insufficient intensity to melt the metallic layer and the beam irradiation time ranging from 10 to 200 μs, and including the plurality of pulses forming a train at intervals of the beam irradiation pausing time of 15 ms or more. As a result, there is an effect in that rapid and accurate machining can be made simply by the laser beam machining step even in the wiring board having the surface coated with the copper foil and including the glass cloth.

According to the present invention, there is provided the laser beam machining method for the wiring board, including the step of exposing the machined portion by previously removing, through another machining method such as etching, the metallic layer positioned at the target position for laser beam irradiation and in the range smaller than the area to be machined. As a result, there are effects of improved absorption of the laser beam, and efficient and more stable drilling.

According to the present invention, there is provided the laser beam machining method for the wiring board, including the step of previously making the surface roughening to the surface of the metallic layer on the surface of the wiring board before the laser beam irradiation. As a result, there are effects in that the metallic layer can be removed by improving the absorption of the laser beam even in case of low peak output of the laser beam, and efficient and more stable drilling can be made.

According to the present invention, there is provided the laser beam machining method for the wiring board, including the step of, at a time of pulsed laser beam irradiation while sequentially positioning the spot of the laser beam at the target positions on the wiring board in synchronization with the pulse frequency of the laser beam, providing the time interval of 15 ms or more between the two optional successive pulsed laser beams for irradiation of the respective target positions irrespective of the pulse frequency by irradiating another target position with the pulsed laser beam outputted for the time interval therebetween. As a result, there is an effect in that the high quality platable hole can be provided with little formation of the char layer and no projection of the glass cloth because the beam irradiation can be made with the beam irradiation pausing time of 15 ms or more ensured for each machined portion even when the laser beam having high pulse frequency is used. Further, there is another effect in that the scanning frequency of the spot of the laser beam can be increased to its limitation so as to enable the high-speed drilling, and drill for many holes in a short time, thereby significantly improving productivity of the wiring board.

According to the present invention, there is provided the laser beam machining method for the wiring board, including the steps of providing the plurality of machining stations on which the wiring boards to be machined are mounted, sequentially dividing the pulsed laser beam outputted from the laser oscillator among the plurality of machining stations for each pulse, and introducing the pulsed laser beam into the plurality of machining stations at the time intervals of 15 ms or more. As a result, there are effects in that rapid machining for the conduction hole can be made at the plurality of machining stations without a reduction in quality of the machined hole, and productivity of the wiring board can significantly be enhanced.

According to the present invention, there is provided the laser beam machining method for the wiring board, in which the carbonic acid gas laser is used as a light source of the laser beam. With the use of the carbonic acid gas laser having high absorption coefficient shown by the glass, there is an effect of rapid and accurate machining even in the wiring board containing the glass cloth, which is difficult to machine in other lasers.

According to the present invention, there is provided the laser beam machining method for the wiring board, in which the wiring board contains the glass cloth. As a result, there are effects in that projection of the glass cloth can be reduced, and the wiring board containing the glass cloth can rapidly and accurately be machined.

According to the present invention, there is provided the laser beam machining apparatus for the wiring board, including the optical mechanism to change a direction of the laser beam and move the laser beam on the wiring board while sequentially positioning the spot of the laser beam at the target positions on the wiring board, and the control mechanism for synchronous control between the pulse oscillating operation of the laser beam oscillator and the operation of the optical mechanism, and control of the optical mechanism such that the time interval can be set to 15 ms or more between the two optional successive pulsed laser beams for irradiation of the target positions irrespective of the pulse frequency of the laser oscillator. As a result, there is an effect in that the high quality platable hole can be provided with little formation of the char layer and no projection of the glass cloth because the beam irradiation can be made with the beam irradiation pausing time of 15 ms or more ensured for each machined portion even when the laser beam having high pulse frequency is used. Further, there is another effect in that the scanning frequency of the spot of the laser beam can be increased to its limitation so as to enable the high-speed drilling, and drill for many holes in a short time, thereby significantly improving productivity of the wiring board.

According to the present invention, there is provided the laser beam machining apparatus for the wiring board, including the optical mechanism to sequentially divide the pulsed laser beam outputted from the laser oscillator among the plurality of machining stations for each pulse and introduce the pulsed laser beam into the plurality of machining stations for each pulse at time intervals of 15 ms or more, and the synchronization control mechanism for synchronous control between the dividing operation of the optical mechanism and the pulse oscillating operation of the laser oscillator. As a result, there is an effect in that rapid machining for the conduction hole can be made at the plurality of machining stations without a reduction in quality of the machined hole.

According to the present invention, there is provided the laser beam machining apparatus for the wiring board, including the optical mechanism provided with the at least one rotary chopper rotated at the predetermined speed of rotation, having the plurality of reflection surfaces and the plurality of passing portions at positions equally dividing the periphery about the axis in the plane perpendicular to the rotation axis, and the synchronization control mechanism provided with the trigger generating apparatus to generate the trigger each time all the equally divided areas including the plurality of reflection surfaces and the plurality of passing portions in the rotary chopper respectively move across the optical axis of the laser beam. As a result, there is an effect in that rapid machining for the conduction hole can be made at the plurality of machining stations without a reduction in quality of the machined hole.

According to the present invention, there is provided the carbonic acid gas laser oscillator for machining the wiring board, in which the length of the discharge space in the gas flow direction is equal to or more than the width of the aperture, the optical axis passing through the center of the aperture is set to be positioned in the range that the entire area of the aperture does not extend off the area extending in the gas flow direction of the discharge space and on the farthest upstream side of the gas flow, and the rise time and the fall time are set to 50 $\mu$s or less in the discharge power fed to the discharge space. As a result, there are effects in that it is possible to reduce the rise and the fall of the laser beam, and obtain the laser beam with the short beam irradiation time suitable for machining of the wiring board.

While preferred embodiments of the invention have been described using specific terms, such description is for illustrative purposes only, and it is to be understood that changes and variations may be made without departing from the spirit or scope of the following claims.

What is claimed is:

1. A laser beam machining method for a wiring board, using a laser beam for machining such as drilling for a through-hole and a blind via hole, grooving, and cutting for an outside shape of the wiring board with a metallic layer formed on a base material surface, and the method comprising the steps of:

forming the metallic layer having a desired shape by partially removing the metallic layer by pulse irradiation with a laser beam having sufficient intensity to melt and remove the metallic layer; and additionally irradiating a machined portion of the wiring board through the metallic layer removed portion with the laser beam having insufficient intensity to melt the metallic layer and a beam irradiation time ranging from 10 to 200 $\mu$s, and including a plurality of pulses forming a train at intervals of a beam irradiation pausing time of 15 ms or more.

2. A laser beam machining method for a wiring board according to claim 1, wherein the machined portion is exposed by previously removing, through another machining method such as etching, the metallic layer positioned at a target position for laser beam irradiation and in the range smaller than an area to be machined.

3. A laser beam machining method for a wiring board according to claim 1, wherein surface roughening is previously made to a surface of the metallic layer on a surface of the wiring board before the laser beam irradiation.

* * * * *